United States Patent
Jiang et al.

(10) Patent No.: US 9,280,992 B1
(45) Date of Patent: Mar. 8, 2016

(54) HYBRID LONGITUDINAL-FIELD BIAS SIDE SHIELD FOR A SCISSOR MAGNETIC SENSOR AND METHODS OF MAKING THE SAME

(71) Applicant: HGST Netherlands B.V., Amsterdam (NL)

(72) Inventors: Hongquan Jiang, San Jose, CA (US); Quang Le, San Jose, CA (US); Xiaoyong Liu, San Jose, CA (US); Lei Wang, Fremont, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/811,754

(22) Filed: Jul. 28, 2015

(51) Int. Cl.
*G11B 5/39* (2006.01)

(52) U.S. Cl.
CPC .......................................... *G11B 5/39* (2013.01)

(58) Field of Classification Search
CPC ...... G11B 5/39; G11B 5/3945; G11B 5/3903; G11B 5/127
USPC .................. 360/324, 324.1, 324.2, 324.12
See application file for complete search history.

(56) References Cited

U.S. PATENT DOCUMENTS

| | | | |
|---|---|---|---|
| 8,390,963 B2 | 3/2013 | Dimitrov et al. | |
| 8,724,265 B2 | 5/2014 | Qiu et al. | |
| 8,749,926 B1 | 6/2014 | Le et al. | |
| 8,902,544 B2 | 12/2014 | Braganca et al. | |
| 2002/0196590 A1* | 12/2002 | Saito | B82Y 10/00 360/324.11 |
| 2009/0130491 A1* | 5/2009 | Ohta | B82Y 10/00 428/811.2 |
| 2010/0097729 A1* | 4/2010 | Gill | B82Y 10/00 360/324 |
| 2011/0062537 A1* | 3/2011 | Oh | B82Y 25/00 257/421 |
| 2013/0148418 A1* | 6/2013 | Luo | G11C 11/1675 365/158 |
| 2014/0268428 A1 | 9/2014 | Dimitrov et al. | |
| 2015/0002961 A1 | 1/2015 | Keener et al. | |
| 2015/0154991 A1* | 6/2015 | Le | G11B 5/3906 360/97.11 |

OTHER PUBLICATIONS

Nakatani, T., "Scissors-type Trilayer Giant Magnetoresistive Sensor using Heusler Alloy Ferromagnet for Narrow Reader of Ultra-high Density Hard Disk Drives," National Institute for Materials Science, Oct. 31, 2011, retrieved from website: http://www.nims.go.jp/eng/news/press/2011/10/p201110310.html, pp. 1-3.

* cited by examiner

*Primary Examiner* — Allen T Cao
(74) *Attorney, Agent, or Firm* — Zilka-Kotab, PC

(57) ABSTRACT

In one embodiment, a magnetic sensor includes: a lower scissor free layer; an upper scissor free layer above the lower scissor free layer; a separation layer between the upper and lower scissor free layers; and upper stabilization layers on opposite sides of the upper scissor free layer in a cross-track direction, where lower surfaces of the upper stabilization layers are above a plane extending along a top surface of the separation layer. In another embodiment, a magnetic sensor includes: a lower scissor free layer; an upper scissor free layer above the lower scissor free layer; a separation layer between the upper and lower scissor free layers; and lower stabilization layers on opposite sides of the lower scissor free layer in a cross-track direction, where upper surfaces of the lower stabilization layers are below a plane extending along a bottom surface of the separation layer.

25 Claims, 22 Drawing Sheets

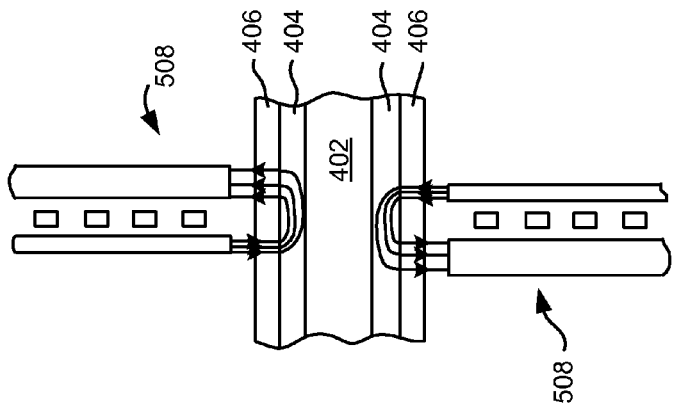
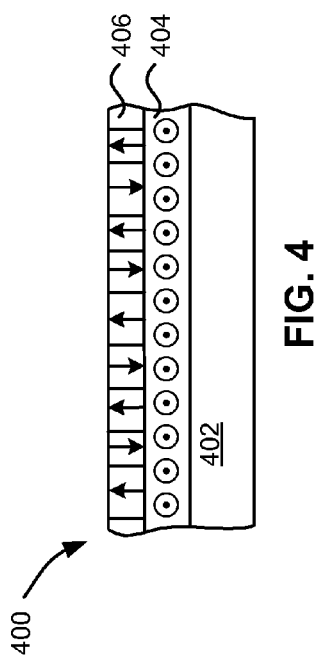
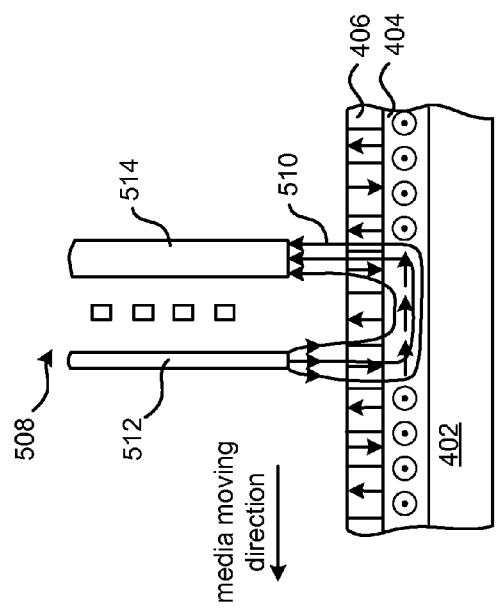

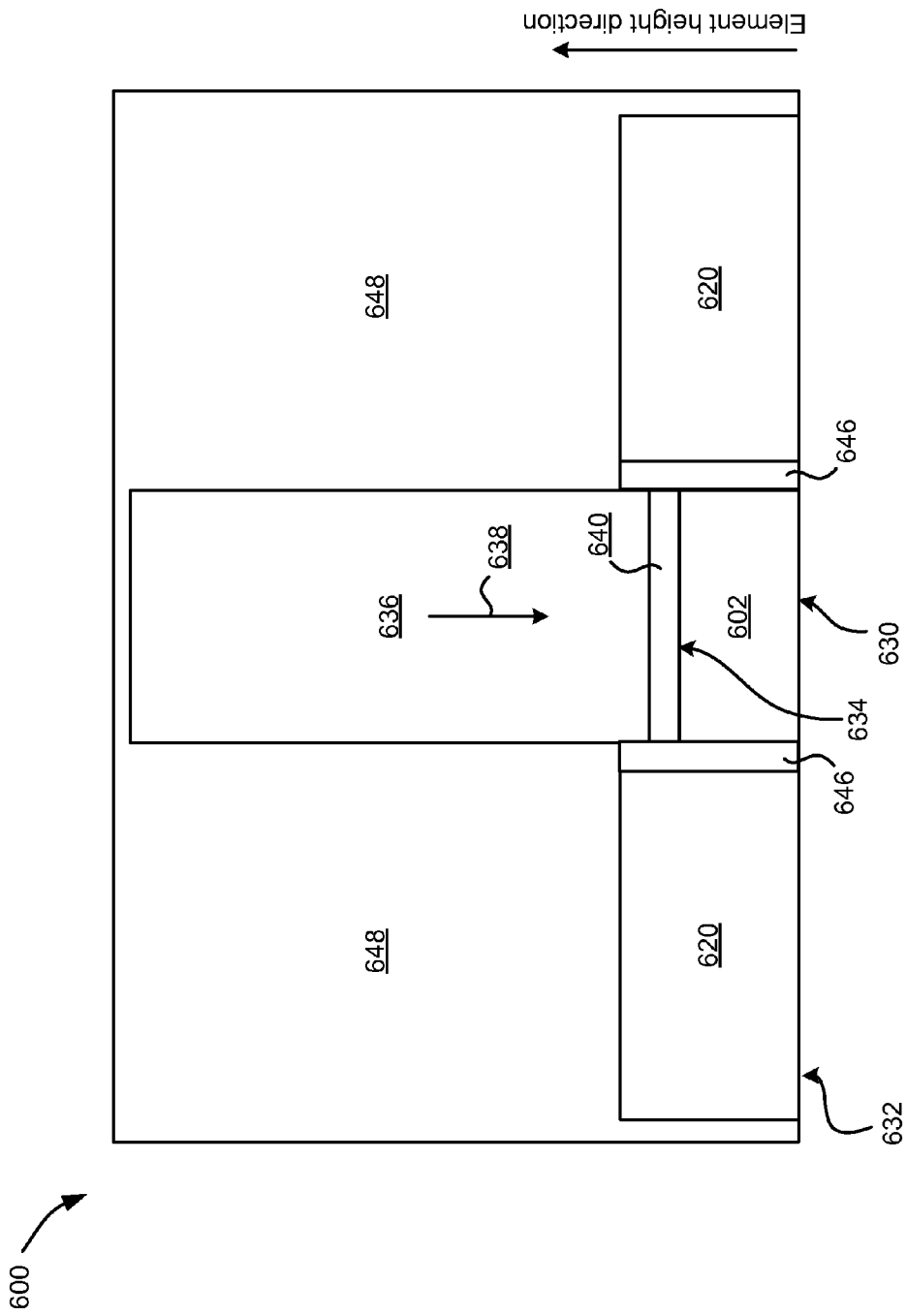

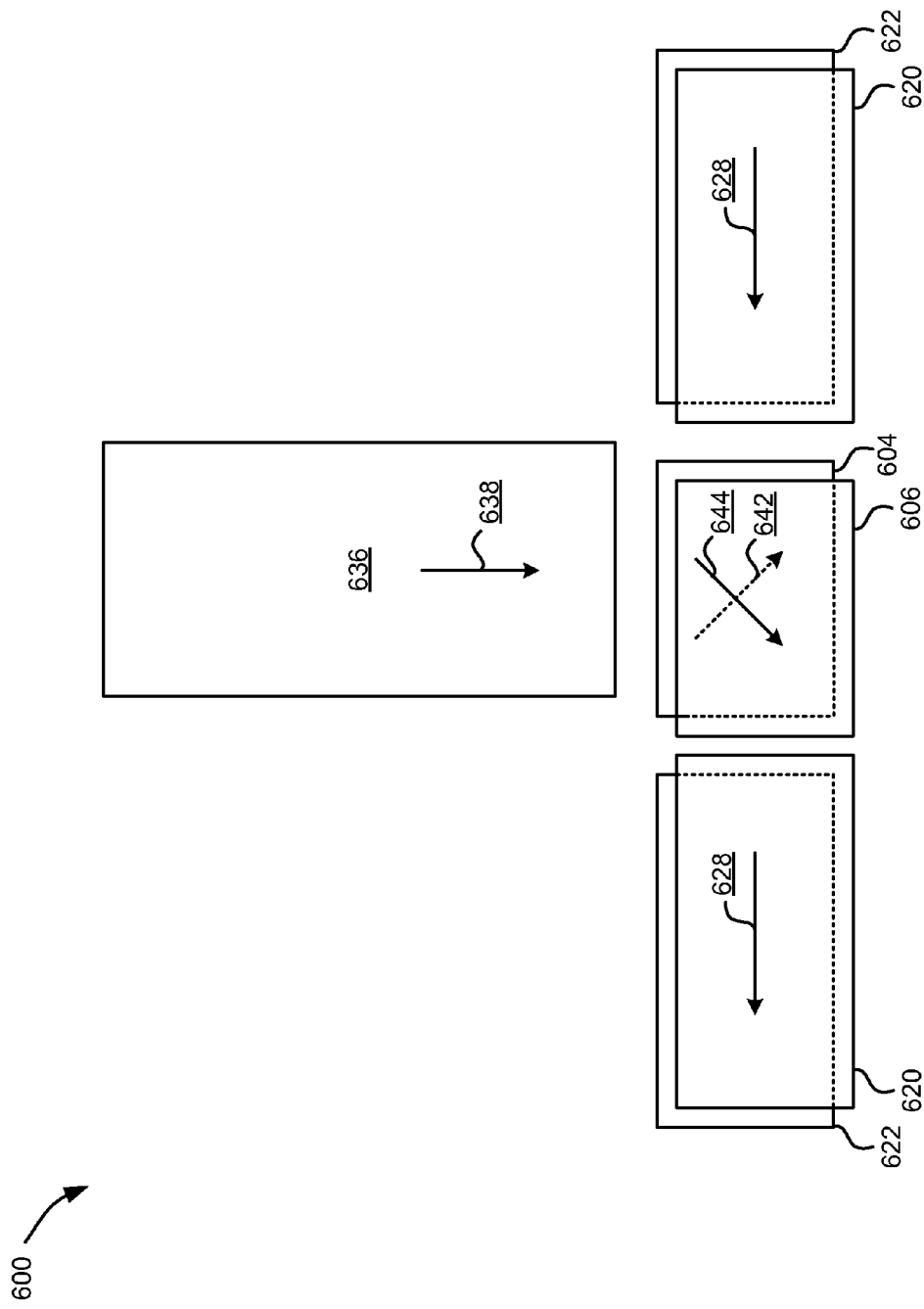

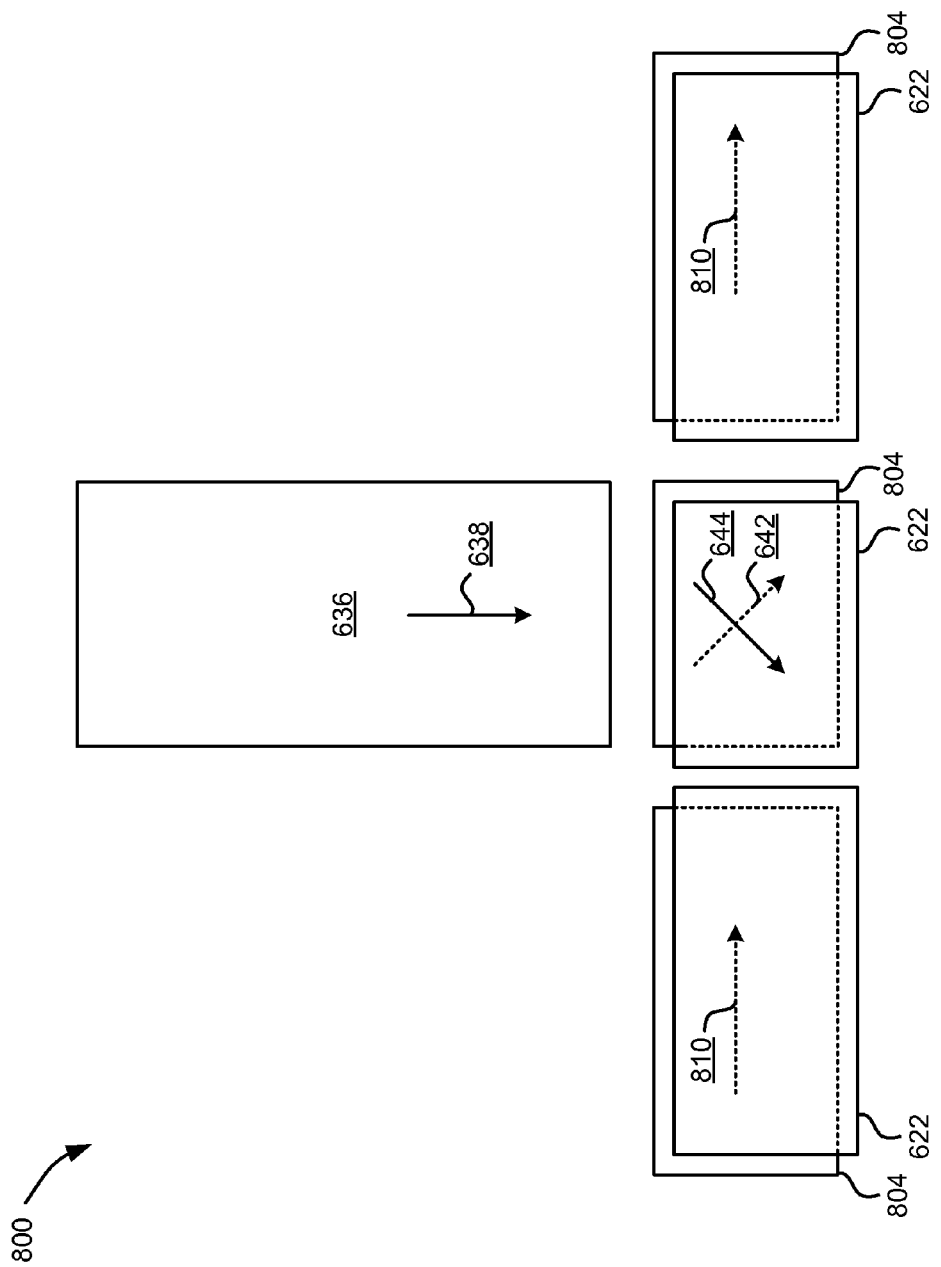

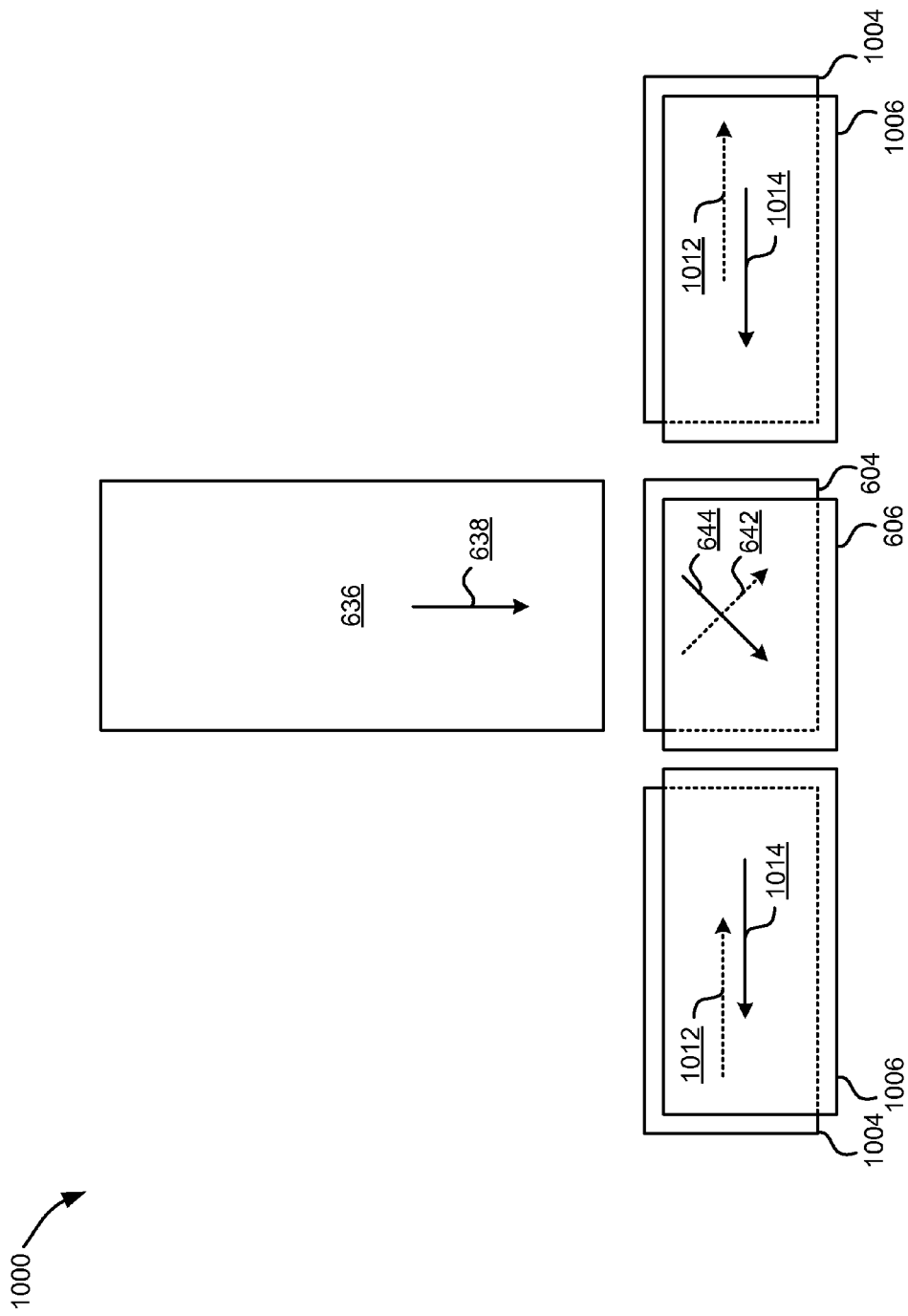

HYBRID LONGITUDINAL-FIELD BIAS SIDE SHIELD FOR A SCISSOR MAGNETIC SENSOR AND METHODS OF MAKING THE SAME

FIELD OF THE INVENTION

The present invention relates to data storage systems, and more particularly, this invention relates to a hybrid longitudinal-field ("L-field") bias side shield for use with a scissor type magnetoresistive sensor.

BACKGROUND

The heart of a computer is a magnetic hard disk drive (HDD) which typically includes a rotating magnetic disk, a slider that has read and write heads, a suspension arm above the rotating disk and an actuator arm that swings the suspension arm to place the read and/or write heads over selected data tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic signal fields from the rotating disk. The read and write heads are connected to processing circuitry that operates according to a computer program to implement the writing and reading functions.

The volume of information processing in the information age is increasing rapidly. In particular, it is desired that HDDs be able to store more information in their limited area and volume. A technical approach to meeting this desire is to increase the capacity by increasing the recording density of the HDD. To achieve higher recording density, further miniaturization of recording bits is effective, which in turn typically requires the design of smaller and smaller components.

The further miniaturization of the various components, however, presents its own set of challenges and obstacles. As areal density increases the read transducers need to be produced to be smaller and closer together, which results in cross-talk, interference, and/or degradation of performance of the various components, such as sensors, within the magnetic heads.

SUMMARY

According to one embodiment, a magnetic sensor includes: a lower scissor free layer; an upper scissor free layer above the lower scissor free layer; a separation layer between the upper and lower scissor free layers; and upper stabilization layers on opposite sides of the upper scissor free layer in a cross-track direction, where lower surfaces of the upper stabilization layers are above a plane extending along a top surface of the separation layer.

According to another embodiment, a magnetic sensor includes: a lower scissor free layer; an upper scissor free layer above the lower scissor free layer; a separation layer between the upper and lower scissor free layers; and lower stabilization layers on opposite sides of the lower scissor free layer in a cross-track direction, where upper surfaces of the lower stabilization layers are below a plane extending along a bottom surface of the separation layer.

Any of these embodiments may be implemented in a magnetic data storage system such as a disk drive system, which may include a magnetic head, a drive mechanism for passing a magnetic medium (e.g., hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 4 is a schematic representation of a perpendicular recording medium, according to one embodiment.

FIG. 5A is a schematic representation of a recording head and the perpendicular recording medium of FIG. 4, according to one embodiment.

FIG. 5B is a schematic representation of a recording apparatus configured to record separately on both sides of a perpendicular recording medium, according to one embodiment.

FIG. 6B is a top down view of the magnetic read head of FIG. 6A as seen from line A-A of FIG. 6A.

FIG. 6C is a top down view of a simplified schematic of the magnetic read head of FIG. 6A as seen from line A-A of FIG. 6A.

FIG. 8B is a top down view of the magnetic read head of FIG. 8A as seen from line B-B of FIG. 8A.

FIG. 10B is a top down view of the magnetic read head of FIG. 10A as seen from line C-C of FIG. 10A.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of disk-based storage systems and/or related systems and methods, as well as operation and/or component parts thereof.

In one general embodiment, a magnetic sensor includes: a lower scissor free layer; an upper scissor free layer above the lower scissor free layer; a separation layer between the upper and lower scissor free layers; and upper stabilization layers on opposite sides of the upper scissor free layer in a cross-track direction, where lower surfaces of the upper stabilization layers are above a plane extending along a top surface of the separation layer.

In another general embodiment, a magnetic sensor includes: a lower scissor free layer; an upper scissor free layer above the lower scissor free layer; a separation layer between the upper and lower scissor free layers; and lower stabilization layers on opposite sides of the lower scissor free layer in a cross-track direction, where upper surfaces of the lower stabilization layers are below a plane extending along a bottom surface of the separation layer.

Figure 1:
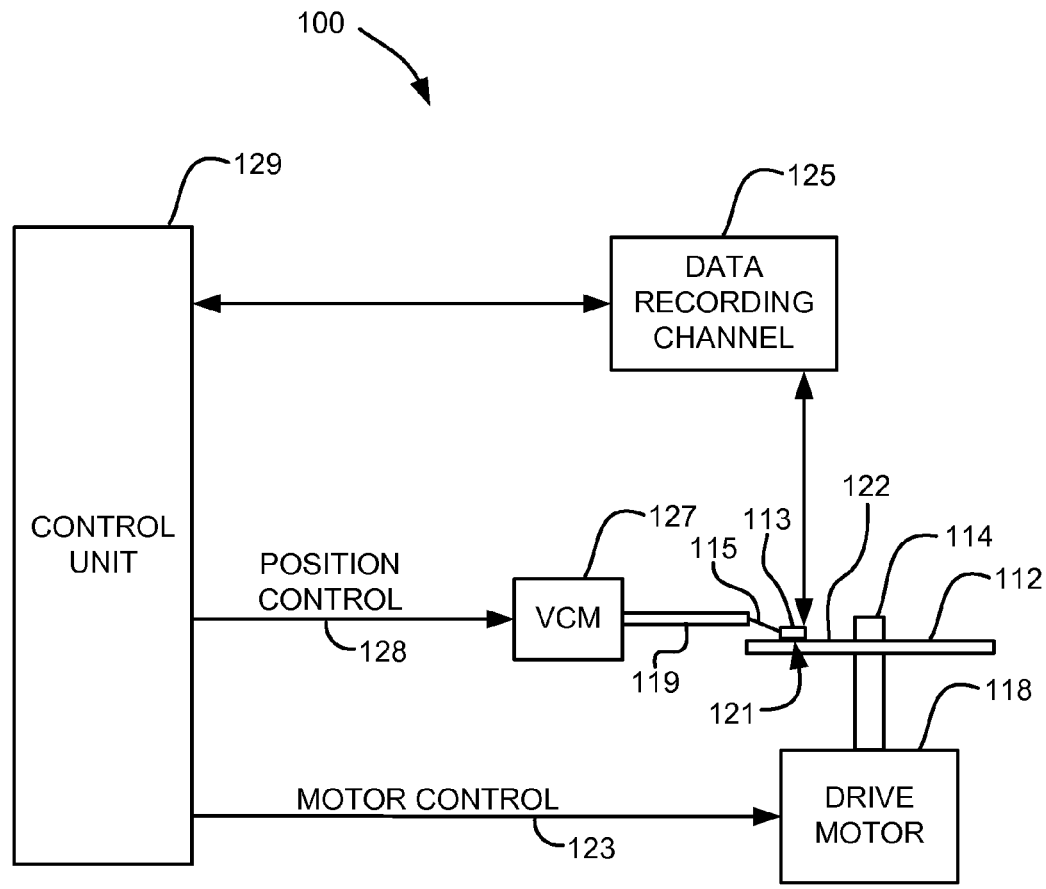
FIG. 1 is a simplified drawing of a magnetic recording disk drive system, according to one embodiment.

Referring now to FIG. 1, there is shown a disk drive 100 in accordance with one embodiment of the present invention. As shown in FIG. 1, at least one rotatable magnetic medium (e.g., magnetic disk) 112 is supported on a spindle 114 and rotated by a drive mechanism, which may include a disk drive motor 118. The magnetic recording on each disk is typically in the form of an annular pattern of concentric data tracks (not shown) on the disk 112. Thus, the disk drive motor 118 preferably passes the magnetic disk 112 over the magnetic read/write portions 121, described immediately below.

At least one slider 113 is positioned near the disk 112, each slider 113 supporting one or more magnetic read/write portions 121, e.g., of a magnetic head according to any of the approaches described and/or suggested herein. As the disk rotates, slider 113 is moved radially in and out over disk surface 122 so that portions 121 may access different tracks of the disk where desired data are recorded and/or to be written. Each slider 113 is attached to an actuator arm 119 by means of a suspension 115. The suspension 115 provides a slight spring force which biases slider 113 against the disk surface 122. Each actuator arm 119 is attached to an actuator 127. The actuator 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of disk 112 generates an air bearing between slider 113 and disk surface 122 which exerts an upward force or lift on the slider. The air bearing thus counter-balances the slight spring force of suspension 115 and supports slider 113 off and slightly above the disk surface by a small, substantially constant spacing during normal operation. Note that in some embodiments, the slider 113 may slide along the disk surface 122.

The various components of the disk storage system are controlled in operation by control signals generated by controller 129, such as access control signals and internal clock signals. Typically, control unit 129 comprises logic control $circuit_s$, storage (e.g., memory), and a microprocessor. In a preferred approach, the control unit 129 is electrically coupled (e.g., via wire, cable, line, etc.) to the one or more magnetic read/write portions 121, for controlling operation thereof. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Read and write signals are communicated to and from read/write portions 121 by way of recording channel 125.

The above description of a magnetic disk storage system, and the accompanying illustration of FIG. 1 is for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

Regarding a magnetic head, an inductive write portion therein includes a coil layer embedded in one or more insulation layers (insulation stack), the insulation stack being located between first and second pole piece layers. A gap may be formed between the first and second pole piece layers by a gap layer at an air bearing surface (ABS) of the write portion. The pole piece layers may be connected at a back gap. Currents are conducted through the coil layer, which produce magnetic fields in the pole pieces. The magnetic fields fringe across the gap at the ABS for the purpose of writing bits of magnetic field information in tracks on moving media, such as in tracks on a rotating magnetic disk.

The second pole piece layer has a pole tip portion which extends from the ABS to a flare point and a yoke portion which extends from the flare point to the back gap. The flare point is where the second pole piece begins to widen (flare) to form the yoke. The placement of the flare point directly affects the magnitude of the magnetic field produced to write information on the recording medium.

Figure 2A:
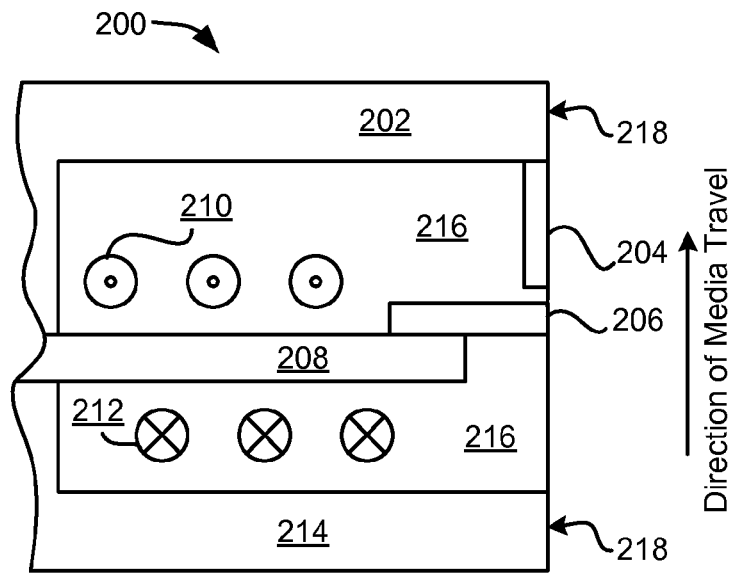
FIG. 2A is a cross-sectional view of a perpendicular magnetic head with helical coils, according to one embodiment.

FIG. 2A is a cross-sectional view of a perpendicular magnetic head 200, according to one embodiment. In FIG. 2A, helical coils 210 and 212 are used to create magnetic flux in the stitch pole 208, which then delivers that flux to the main pole 206. Coils 210 indicate coils extending out from the page, while coils 212 indicate coils extending into the page. Stitch pole 208 may be recessed from the ABS 218. Insulation 216 surrounds the coils and may provide support for some of the elements. The direction of the media travel, as indicated by the arrow to the right of the structure, moves the media past the lower return pole 214 first, then past the stitch pole 208, main pole 206, trailing shield 204 which may be connected to the wrap around shield (not shown), and finally past the upper return pole 202. Each of these components may have a portion in contact with the ABS 218. The ABS 218 is indicated across the right side of the structure.

Perpendicular writing is achieved by forcing flux through the stitch pole 208 into the main pole 206 and then to the surface of the disk positioned towards the ABS 218.

Figure 2B:
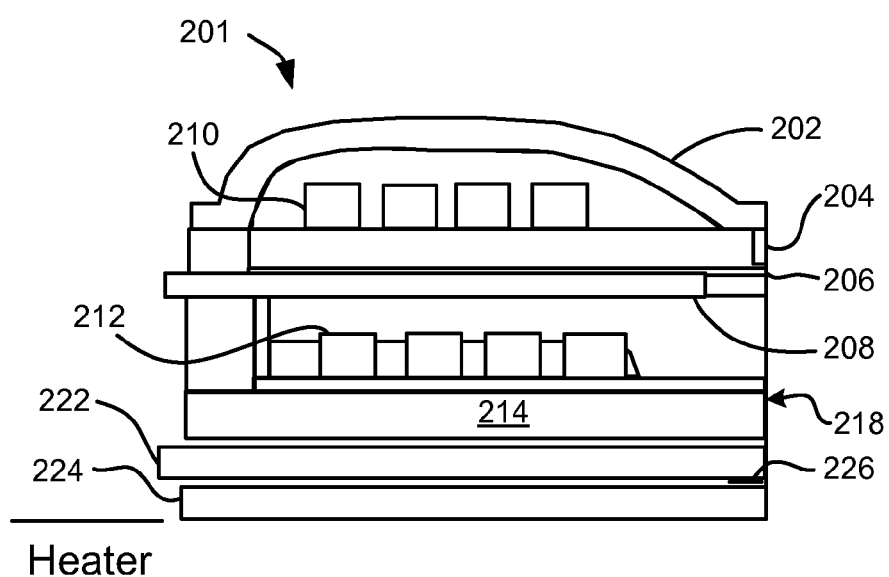
FIG. 2B is a cross-sectional view of a piggyback magnetic head with helical coils, according to one embodiment.

FIG. 2B illustrates one embodiment of a piggyback magnetic head 201 having similar features to the head 200 of FIG. 2A. As shown in FIG. 2B, two shields 204, 214 flank the stitch pole 208 and main pole 206. Also sensor shields 222, 224 are shown. The sensor 226 is typically positioned between the sensor shields 222, 224.

Figure 3A:
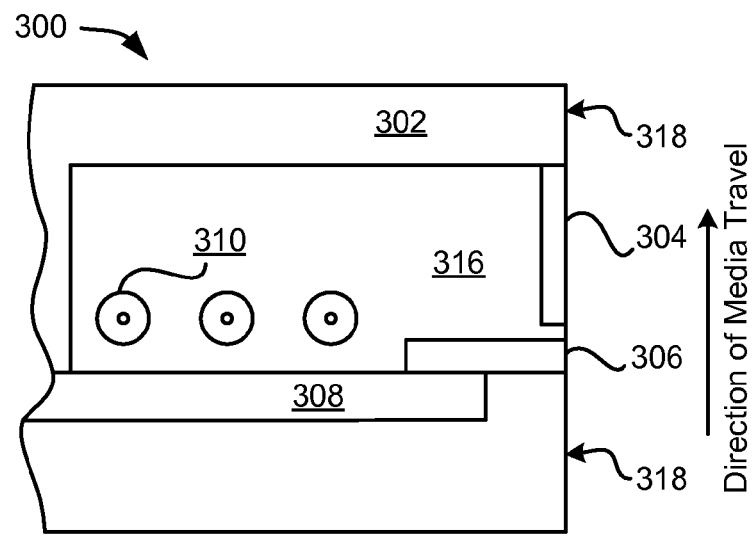
FIG. 3A is a cross-sectional view of a perpendicular magnetic head with looped coils, according to one embodiment.

FIG. 3A is a schematic diagram of another embodiment of a perpendicular magnetic head 300, which uses looped coils 310 to provide flux to the stitch pole 308, a configuration that is sometimes referred to as a pancake configuration. The stitch pole 308 provides the flux to the main pole 306. With this arrangement, the lower return pole may be optional. Insulation 316 surrounds the coils 310, and may provide support for the stitch pole 308 and main pole 306. The stitch pole may be recessed from the ABS 318. The direction of the media travel, as indicated by the arrow to the right of the structure, moves the media past the stitch pole 308, main pole 306, trailing shield 304 which may be connected to the wrap around shield (not shown), and finally past the upper return pole 302 (all of which may or may not have a portion in contact with the ABS 318). The ABS 318 is indicated across the right side of the structure. The trailing shield 304 may be in contact with the main pole 306 in some embodiments.

Figure 3B:
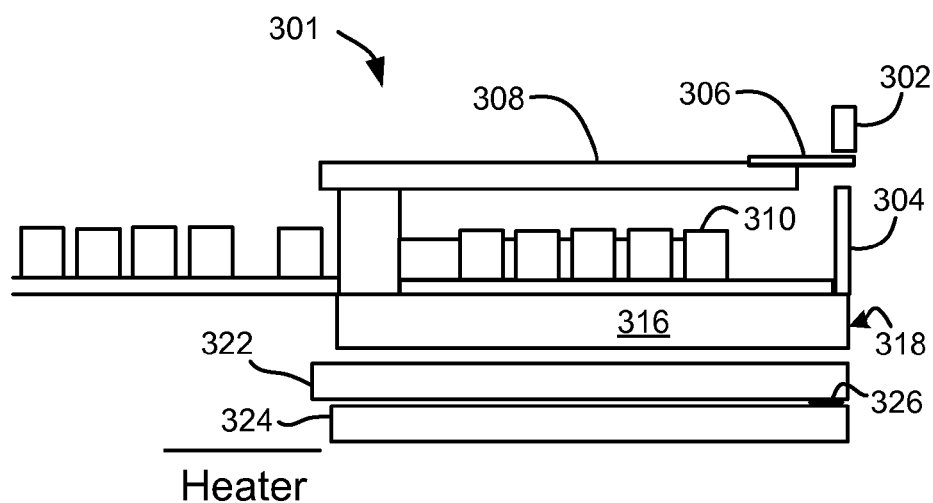
FIG. 3B is a cross-sectional view of a piggyback magnetic head with looped coils, according to one embodiment.

FIG. 3B illustrates another embodiment of a piggyback magnetic head 301 having similar features to the head 300 of FIG. 3A. As shown in FIG. 3B, the piggyback magnetic head 301 also includes a looped coil 310, which wraps around to form a pancake coil. Sensor shields 322, 324 are additionally shown. The sensor 326 is typically positioned between the sensor shields 322, 324.

In FIGS. 2B and 3B, an optional heater is shown near the non-ABS side of the magnetic head. A heater (Heater) may also be included in the magnetic heads shown in FIGS. 2A and 3A. The position of this heater may vary based on design parameters such as where the protrusion is desired, coefficients of thermal expansion of the surrounding layers, etc.

FIG. 4 provides a schematic diagram of a simplified perpendicular recording medium 400, which may also be used with magnetic disk recording systems, such as that shown in FIG. 1. As shown in FIG. 4, the perpendicular recording medium 400, which may be a recording disk in various approaches, comprises at least a supporting substrate 402 of a suitable non-magnetic material (e.g., glass, aluminum, etc.), and a soft magnetic underlayer 404 of a material having a high magnetic permeability positioned above the substrate 402. The perpendicular recording medium 400 also includes a magnetic recording layer 406 positioned above the soft magnetic underlayer 404, where the magnetic recording layer 406 preferably has a high coercivity relative to the soft magnetic underlayer 404. There may one or more additional layers (not shown), such as an "exchange-break" layer or "interlayer", between the soft magnetic underlayer 404 and the magnetic recording layer 406.

The orientation of magnetic impulses in the magnetic recording layer 406 is substantially perpendicular to the surface of the recording layer. The magnetization of the soft magnetic underlayer 404 is oriented in (or parallel to) the plane of the soft magnetic underlayer 404. As particularly shown in FIG. 4, the in-plane magnetization of the soft magnetic underlayer 404 may be represented by an arrow extending into the paper.

FIG. 5A illustrates the operative relationship between a perpendicular head 508 and the perpendicular recording medium 400 of FIG. 4. As shown in FIG. 5A, the magnetic flux 510, which extends between the main pole 512 and return pole 514 of the perpendicular head 508, loops into and out of the magnetic recording layer 406 and soft magnetic underlayer 404. The soft magnetic underlayer 404 helps focus the magnetic flux 510 from the perpendicular head 508 into the magnetic recording layer 406 in a direction generally perpendicular to the surface of the magnetic medium. Accordingly, the intense magnetic field generated between the perpendicular head 508 and the soft magnetic underlayer 404, enables information to be recorded in the magnetic recording layer 406. The magnetic flux is further channeled by the soft magnetic underlayer 404 back to the return pole 514 of the head 508.

As noted above, the magnetization of the soft magnetic underlayer 404 is oriented in (parallel to) the plane of the soft magnetic underlayer 404, and may represented by an arrow extending into the paper. However, as shown in FIG. 5A, this in plane magnetization of the soft magnetic underlayer 404 may rotate in regions that are exposed to the magnetic flux 510.

FIG. 5B illustrates one embodiment of the structure shown in FIG. 5A, where soft magnetic underlayers 404 and magnetic recording layers 406 are positioned on opposite sides of the substrate 402, along with suitable recording heads 508 positioned adjacent the outer surface of the magnetic recording layers 406, thereby allowing recording on each side of the medium.

Except as otherwise described herein with reference to the various inventive embodiments, the various components of the structures of FIGS. 1-5B, and of other embodiments disclosed herein, may be of conventional material(s), design, and/or fabricated using conventional techniques, as would become apparent to one skilled in the art upon reading the present disclosure.

As discussed previously, there is a continual push to increase the recording density of HDDs. One method of increasing the recording density of HDDs is to decrease the size of a magnetic read sensor. With specific regard to linear data density along a data track, this generally means reducing the gap thickness of a magnetic sensor.

Currently used sensors, such as Giant Magnetoresistive (GMR) sensors and Tunnel Junction Magnetoresisive (TMR) sensors, typically require 4 magnetic layers, 3 ferromagnetic (FM) and 1 antiferromagnetic (AFM) layer, along with additional nonmagnetic layers. Only one of the magnetic layers serves as the active (or free) sensing layer. The remaining "pinning" and "pinned" layers, while necessary, nonetheless consume a large amount of gap thickness. One way to overcome this is to construct a sensor as a "scissor" sensor that uses only two magnetic "free" layers without additional pinning and pinned layers, thus potentially reducing gap thickness to a significant degree. However, the use of such a magnetic sensor results in design and manufacturing challenges. For instance, a particular challenge presented by such a structure regards proper magnetic biasing of the two free layers of the scissor sensor.

Embodiments disclosed herein are directed to magnetic scissor sensors having novel hybrid side shield structures configured to provide longitudinal-field (L-field) biasing.

Figure 6A:
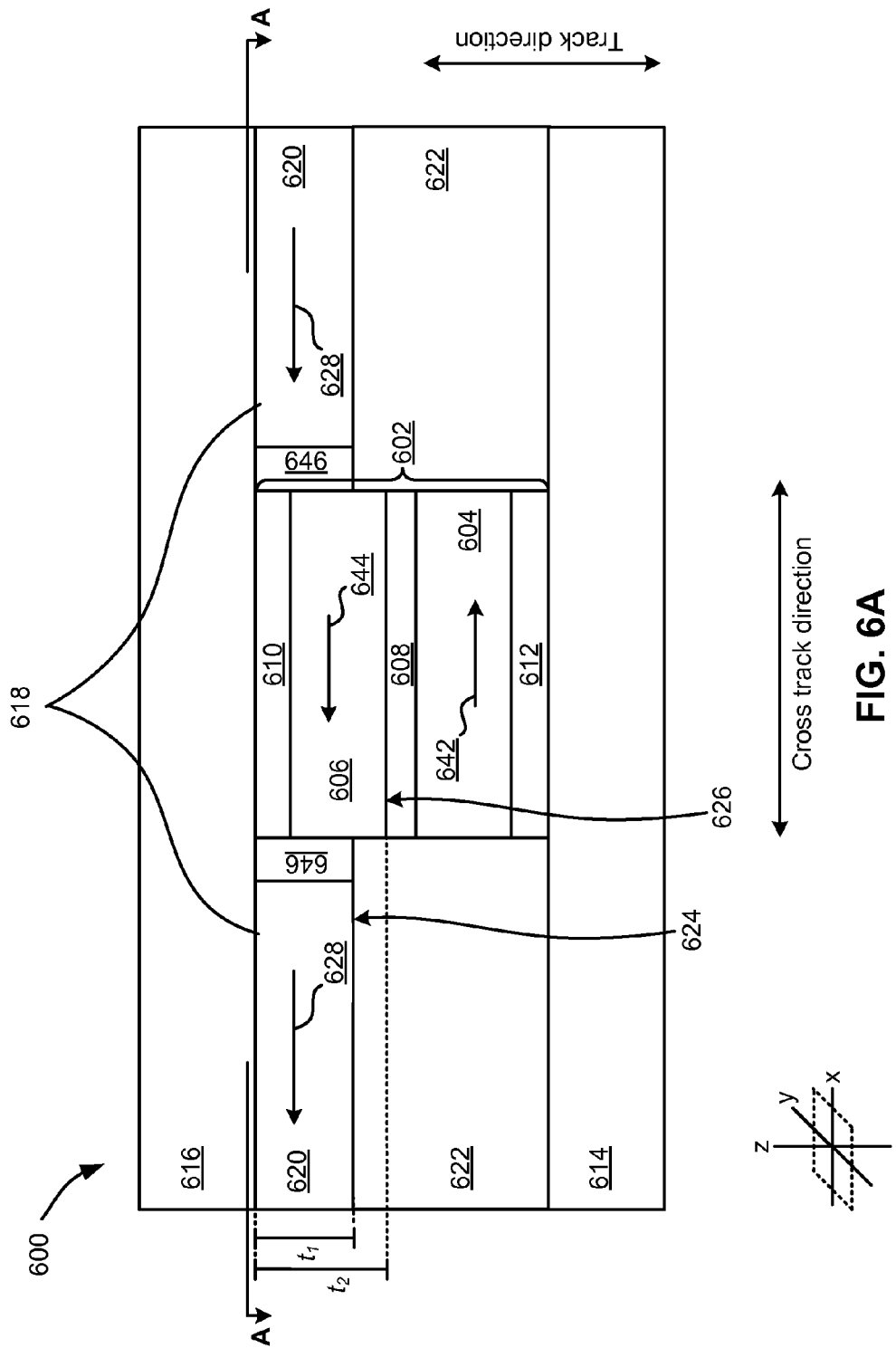
FIG. 6A is an media facing side view of a magnetic read head in which L-field stabilization is applied to the upper scissor free layer, according to one embodiment.

Referring now to FIGS. 6A-6C, various views of a magnetic read head 600 are shown in accordance with one embodiment. As an option, the magnetic read head 600 may be implemented in conjunction with features from any other embodiment listed herein, such as those described with reference to the other FIGS. Of course, the magnetic read head 600 and others presented herein may be used in various applications and/or in permutations which may or may not be specifically described in the illustrative embodiments listed herein. For instance, the magnetic read head 600 may include more or less components than those shown in FIGS. 6A-6C, in various approaches. Moreover, unless otherwise specified, one or more components of the magnetic read head 600 may be of conventional material(s), design, and/or fabricated using conventional techniques (e.g., sputtering, plating, atomic layer deposition (ALD), chemical vapor deposition (CVD), etc.), as would become apparent to one skilled in the art upon reading the present disclosure.

As shown in the media facing side view provided in FIG. 6A, the magnetic read head 600 has a scissor sensor stack 602 that includes a lower scissor free layer 604, and an upper scissor free layer 606 thereabove in a track direction.

The track direction refers to a direction of travel of one or more data tracks on a magnetic medium, such as the magnetic disk 112 described previously in the context of FIG. 1, as the magnetic medium is rotated by a drive mechanism. The cross track width direction refers to a direction by which the width of a data track on a magnetic medium (e.g., a magnetic disk) may be measured.

In various approaches, the lower scissor free layer 604 and/or the upper scissor free layer 606 of FIG. 6 may comprise one or more layers of magnetic material. Exemplary magnetic materials may include, but are not limited to, Ni, Fe, Co, Hf, B, and combinations thereof.

The lower and upper scissor free layers 604, 606 are magneto-statically coupled across a separation layer 608, in addition to the orange peel coupling. In some approaches, the separation layer 608 may be non-magnetic and electrically insulating. Suitable materials for the separation layer 608 may include, but are not limited to, MgO, $TiO_2$, AlO, alumina, AgSn, combinations thereof, etc.

A capping layer structure 610 may be provided above the upper scissor free layer 606 in the track direction to prevent direct magnetic coupling between upper free layer and the shield and to protect the layers of the sensor stack 602 during manufacture thereof. In preferred approaches, the capping layer structure 610 may be non-magnetic. In more approaches, the capping layer structure 610 may comprise one or more layers. Each layer of the capping layer structure 610 may independently comprise at least one suitable nonmagnetic material such as Ru, Ta, Cr, etc.

The sensor stack 602 may also include a seed layer structure 612 below the lower scissor free layer 604 in a track direction to promote a desired grain growth and magnetism in the above formed layers. In various approaches, the seed layer structure 612 may comprise one or more layers, where each layer may independently comprise NiTa, CrMo, Ti, W, combinations thereof, etc.

As shown in FIG. 6A, the sensor stack 602 is sandwiched between a lower magnetic shield 614 and an upper magnetic shield 616 in a track direction. In various approaches, the lower and/or upper magnetic shields 614, 616 may comprise one or more magnetic materials having a high magnetic permeability ($\mu$) to provide effective magnetic shielding. In particular approaches, the lower and/or upper magnetic shields 614,616 may comprise one or more layers, where each layer may independently include NiFe, and/or CoFe, and/or other suitable magnetic materials as would become apparent to one having skill in the art upon reading the present disclosure.

During operation, a sense current or voltage is applied across the sensor stack 602 in a direction perpendicular to the plane of the layers of the sensor stack 602. In various approaches, the lower and upper magnetic shields 614, 616 may also include an electrically conductive material, and thus may function as electrical leads for supplying the sense current or voltage across the sensor stack 602. The electrical resistance across the sensor stack 602 depends upon the direction of magnetization of the lower and upper scissor free layers 604, 606 relative to one another. The closer the magnetizations of the lower and upper scissor free layers 604, 606 are to being parallel to one another, the lower the resistance will be. Conversely, the closer the magnetizations of the lower and upper scissor free layers 604, 606 are to being antiparallel to one another the higher the resistance will be. Since the orientations of the magnetizations of the lower and upper scissor free layers 604, 606 are free to move in response to an external magnetic field, this change in magnetization direction and resulting change in electrical resistance can be used to detect a magnetic field such as from an adjacent magnetic media (not shown in FIG. 6A). In approaches where the separation layer 608 is an electrically insulating barrier layer, then the scissor sensor operates based on the spin dependent tunneling effect of electrons tunneling through the separation layer 608. In approaches where the separation layer 608 is an electrically conductive spacer layer, then the change in resistance results from spin dependent scattering phenomenon.

As additionally shown in FIG. 6A, the sensor stack 602 is surrounded by a side shield structure 618. In the embodiment shown in FIG. 6A, the side shield structure 618 comprises upper stabilization layers 620 located on opposite sides of the upper scissor free layer 606 in the cross track direction. Each of the upper stabilization layers 620 may be separated from the lower magnetic shield 614 by an isolation layer 622, which may be nonmagnetic and electrically insulating in some approaches. Suitable materials for the isolation layer 622 may include TaO, SiN, AlO, $Al_2O_3$, SiO, MgO, TiO, combinations thereof, etc. Each of the upper stabilization layers 620 may also be separated from the sensor stack 602 by an isolation layer 646, which may preferably be nonmagnetic and electrically insulating in some approaches. Suitable materials for the isolation layer 646 may include TaO, SiN, AlO, $Al_2O_3$, SiO, MgO, TiO, combinations thereof, etc. In some approaches, the isolation layer 622 may comprise the same materials, or one or more different materials, as the isolation layer 646.

In various approaches, the lower surfaces 624 of the upper stabilization layers 620 may lie in substantially the same x-y plane. In preferred approaches, the lower surface 624 of at least one of the upper stabilization layers 620 may be above the x-y plane extending along a top surface 626 of the separation layer 608. In more preferred approaches, the lower surfaces 624 of both upper stabilization layers 620 may be above the x-y plane extending along the top surface 626 of the separation layer 608.

In additional approaches, at least one upper stabilization layer 620 may have a thickness, $t_1$, in a range from about 1 nm to about 10 nm. In various approaches, the thickness of at least one upper stabilization layer 620 may be less than the total thickness, $t_2$, of the upper portion of the sensor stack 602, where the upper portion of the sensor stack 602 includes all layers of the sensor stack that are above the separation layer 608, such as the upper scissor free layer 606 and the capping layer structure 610. In some approaches, the thickness of the upper scissor free layer 606 may be in a range from about 2 nm to about 10 nm, and the thickness of the capping layer structure 610 may be in a range from about 1 nm to about 6 nm. Accordingly, the total thickness of the upper portion of the sensor stack 602 may be in a range from about 3 nm to about 16 nm.

In further approaches, the width of each upper stabilization layer 620 in the cross track direction may be about equal to, or greater than, the width of the upper scissor free layer 606 in the cross track direction. In yet more approaches, the width of each upper stabilization layer 620 may be 2×, 3×, 4×, etc. of the width of the upper scissor free layer 606. The width of the upper scissor free layer 606 may be in a range from about 10 nm to about 50 nm in some approaches. The width of the upper scissor free layer 606 may also be about equal to the width of the lower scissor free layer 604 in additional approaches.

In one particular approach, the upper stabilization layers 620 may each comprise one or more soft magnetic materials, including, but not limited to, NiFe, CoFe, NiFeCr, CoNiFe, alloys thereof, and other such suitable soft magnetic materials having a low magnetic coercivity as known in the art. In approaches where the upper stabilization layers 620 each comprise one or more soft magnetic materials, the upper stabilization layers 620 may be directly exchanged coupled to the upper magnetic shield 616.

Figure 11:
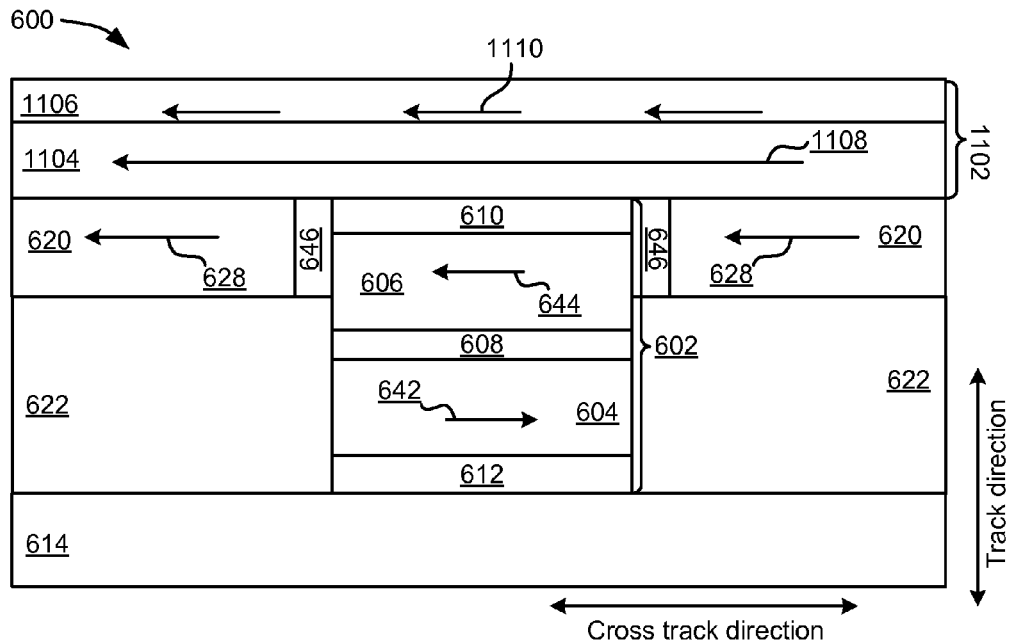
FIG. 11 is a media facing side view of the magnetic read head of FIG. 6A having an upper magnetic shield with a first laminated structure, according to one embodiment.

FIG. 11 provides one exemplary embodiment in which the magnetic read head 600 of FIG. 6A includes upper stabilization layers 620 comprised of soft magnetic material(s), and an upper magnetic shield 1102 that has a first laminated structure. As particularly shown in FIG. 11, the upper magnetic shield 1102 may include an upper magnetic shield layer 1104 and an antiferromagnetic (AFM) layer 1106 thereabove in a track direction, where the upper magnetic shield layer 1104 and the AFM layer 1106 have magnetization 1108 and surface magnetization 1110, respectively, oriented in the same direction as the magnetization 628 of the upper stabilization layers 620. The AFM layer 1106 may comprise PtMn, IrMn, and other suitable AFM material known in the art. The upper magnetic shield layer 1104 may comprise CoFe, NiFeCr, CoNiFe, combinations and/or alloys thereof, etc. The upper magnetic shield layer 1104 and the upper stabilization layers 620 may comprise the same materials as one another, or may comprise one or more different materials having differing magnetic moments (Bs).

Figure 12:
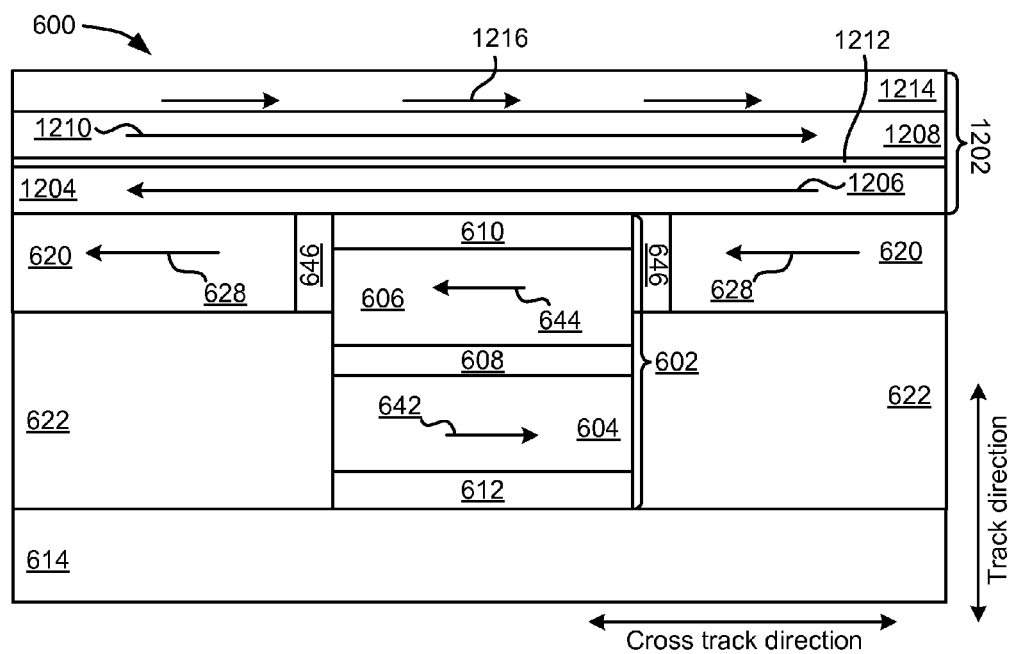
FIG. 12 is a media facing side view of the magnetic read head of FIG. 6A having an upper magnetic shield with a second laminated structure, according to one embodiment.

FIG. 12 provides another exemplary embodiment in which the magnetic read head 600 of FIG. 6A includes upper stabilization layers 620 comprised of soft magnetic material(s), and an upper magnetic shield 1202 that has a second laminated structure. As particularly shown in FIG. 12, the upper magnetic shield 1202 may include a first upper magnetic shield layer 1204 having a magnetization 1206, and a second upper magnetic shield layer 1208 having a magnetization 1210, where one or both of the upper magnetic shield layers 1204, 1208 may include CoFe, NiFeCr, CoNiFe, combinations and/or alloys thereof, etc. At least one of the upper magnetic shield layers 1204, 1208 and the upper stabilization layers 620 may comprise the same materials as one another, or may comprise one or more different materials having differing magnetic moments (Bs).

As also shown in FIG. 12, the upper magnetic shield layers 1204, 1208 are anti-ferromagnetically coupled across a non-magnetic layer 1212 (e.g., comprising Ru). The upper magnetic shield 1202 additionally includes an AFM layer 1214 that has a surface magnetization 1216, and is positioned above the second upper magnetic shield layer 1208.

With continued reference to FIG. 6A, in another particular approach, the upper stabilization layers 620 may each comprise one or more hard magnetic materials, including, but not limited to, CoCr, CoPt, CoCrPt, alloys thereof, and other such suitable hard magnetic materials having a high magnetic coercivity as known in the art. In approaches where the upper stabilization layers 620 each comprise one or more hard magnetic materials, the upper stabilization layers 620 are preferably magnetically decoupled from the upper magnetic shield 616. Accordingly, in such approaches, a decoupling layer may be positioned at least between the upper stabilization layers 620 and the upper magnetic shield 616 in the track direction. This decoupling layer may comprise alumina, or other suitable nonmagnetic material as known in the art.

As shown in the embodiment of FIG. 6A, the upper stabilization layers 620 have a magnetization 628 oriented generally parallel to the media facing side of the magnetic read head 600. The lower and upper scissor free layers 604, 606 have magnetizations 642, 644, respectively. As particularly shown in FIG. 6A, the magnetization 644 of the upper scissor free layer 606 should be in the same direction as the magnetization 628 of the upper stabilization layers 620, but in the opposite direction as the magnetization 642 of the lower scissor free layer 604. The upper stabilization layers 620 are configured to maintain magnetic stabilization of the upper scissor free layer 606, and thus reduce noise during a read operation, as discussed in more detail with reference to FIG. 6B-6C.

FIG. 6B shows a top down view of the magnetic read head 600 as seen from line A-A of FIG. 6A. The capping layer structure 610 positioned above the upper scissor free layer 606 in the track direction, and which may also be positioned above one or more portions of the magnetic bias structure 636, is not shown in FIG. 6B.

FIG. 6B shows the sensor stack 602 having a front edge 630 that extends along the media facing side 632 and a back edge 634 opposite the front edge 630. The distance between the front edge 630 and back edge 634 defines the stripe height of the sensor stack 602.

As can be seen in FIG. 6B, the magnetic read head 600 also includes a magnetic bias structure 636 that extends behind the back edge 634 of the sensor stack 602 in a direction away from the media facing side 632. The magnetization 638 of the magnetic bias structure 636 is oriented in a direction perpendicular to the media facing side 632.

The upper stabilization layers 620 may extend beyond the back edge 634 of the sensor stack 602 in the element height direction in some approaches. The upper stabilization layers 620 may extend to less than, or about equal to, the extent of the magnetic bias structure 636 in the element height direction, in more approaches.

In the embodiment of FIG. 6B, the space behind the upper stabilization layer 620 and at either side of the magnetic bias structure 636 may comprise an insulating fill material 648, preferably a nonmagnetic and electrically insulating fill material. Suitable insulating fill materials may include at least one of TaO, SiN, AlO, $Al_2O_3$, SiO, MgO, TiO, etc. Additionally, an isolating layer 640 may separate the sensor stack 602 and the magnetic bias structure 636, where the isolating layer 640 may also preferably be nonmagnetic and electrically insulating and comprise at least one of TaO, SiN, AlO, $Al_2O_3$, SiO, MgO, TiO, etc.

In some approaches, the magnetic bias structure 636 may comprise a soft magnetic material, including but not limited to Ni, Fe, Co, combinations and/or alloys thereof, etc. It is important to note, however, that in approaches where the magnetic bias structure 636 comprises a soft magnetic material, the width of the magnetic bias structure 636 measured parallel to the media facing side 632 is preferably small relative to its length measured perpendicular to the media facing side 632. In preferred approaches, the length of the magnetic bias structure in the element height direction is at least twice the width thereof in the track width direction. If the width of the magnetic bias structure 636 is less than its length, the magnetic bias structure 636 has a shape enhanced magnetic anisotropy that maintains the magnetization 638 orientation even though the magnetic bias layer structure 636 has a low magnetic coercivity.

In further approaches, the width of the magnetic bias structure 636 may be greater than the width of the sensor stack 602 in the track width direction. Of course, the width of the sensor stack 602 in the track width direction may be greater than, about equal to, or less than the width of the magnetic bias structure 636 in various embodiments, depending on a desired biasing effect, manufacturing limitations and/or efficiencies, positioning of other components of the read sensor and/or magnetic head 600, etc.

Additionally, in approaches where the magnetic bias structure 636 comprises a soft magnetic material, the magnetization 638 of the magnetic bias structure 636 may be maintained via exchange coupling with a layer of anti-ferromagnetic material. While not shown in FIG. 6B, a layer of anti-ferromagnetic material, such as IrMn, PtMn, etc., may be positioned behind the back edge 634 of the sensor stack 602 and below, or alternatively above, the magnetic bias structure 636. While this anti-ferromagnetic layer does not in and of itself have a net magnetization, when it is exchange coupled with a layer of magnetic material in the magnetic bias structure 636, it strongly pins the magnetization thereof.

In other approaches, the magnetic bias structure 636 may comprise a hard magnetic material, including but not limited to CoCr, CoPt, etc. In more approaches, the magnetic bias structure 636 may comprise a soft/hard magnetic composite with one or more soft magnetic layers stacked with one or more hard magnetic layers, as would be understood by one of skill in the art.

FIG. 6C shows a top down view of a simplified schematic of the magnetic read head 600 as also seen from line A-A in FIG. 6A.

With reference to FIG. 6C, in the absence of a magnetic field from the magnetization 638 of the magnetic bias structure 636, the magnetizations 642, 644 of the lower and upper scissor free layers 604, 606, respectively, would tend to align antiparallel to one another in a direction parallel with the media facing side in the usual case where the sensor height is less than the sensor width, or in a direction perpendicular with the media facing side when the sensor height is larger than the sensor width, as a result of the magneto-static coupling of the lower and upper scissor free layers 604, 606. However, the presence of the magnetic field from the magnetization 638 of the magnetic bias structure 636 causes the magnetizations 642, 644 of the scissor free layers 604, 606 to rotate such that the angle between them is less than 180° and they are generally orthogonal as shown.

The magnetizations 642, 644 of the scissor free layers 604, 606 can respond to a magnetic field by rotating in a scissoring fashion. While the magnetic bias structure 636 may rotate the magnetizations 642, 644 of the scissor free layers 604, 606 in desired orthogonal directions, the magnetization 638 of the magnetic bias structure 636 does not prevent the magnetizations 642, 644 of the scissor free layers 604, 606 from flipping direction (e.g., with magnetization 642 pointing to the left of the page and 644 pointing to the right of the page), which would generate low frequency noise in read-back signal.

The magnetization 628 from the upper stabilization layers 620 of the side shield structure 618 helps prevent this. For instance, the magnetization 628 of the upper stabilization layers 620 tends to pull the magnetization 644 of the upper scissor free layer 606 in one direction parallel with the media facing side. The magnetization 642 of the lower scissor free layer 604 remains oriented in an opposite direction that is also parallel with the media facing side due to the magneto-static coupling of the lower and upper scissor free layers 604, 606. This arrangement effectively prevents the magnetizations 642, 644 from flipping direction and improves the stability of the magnetic read head 600.

Figure 7:
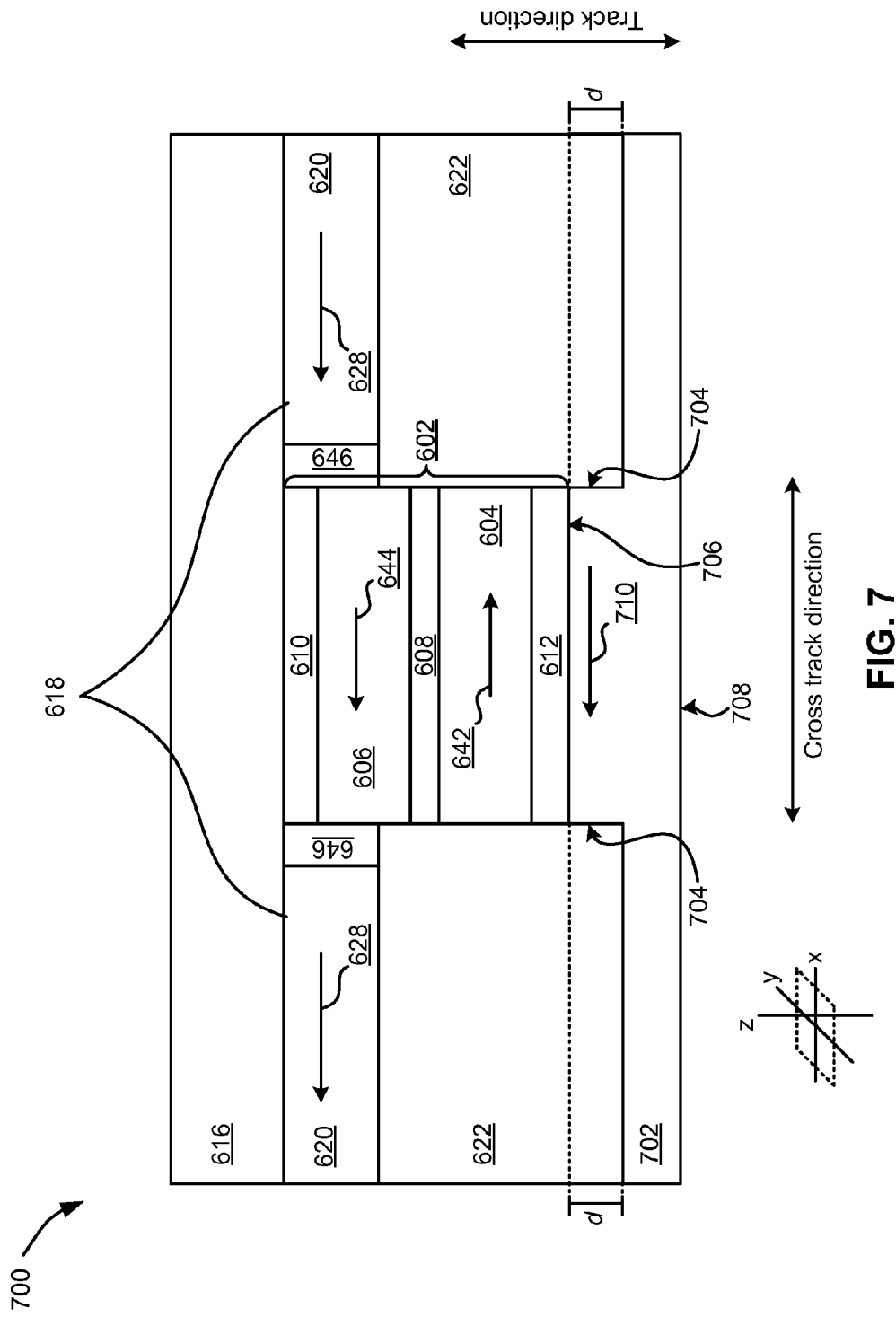
FIG. 7 is a media facing side view of a magnetic read head in which L-field stabilization is applied to the upper scissor free layer via the upper stabilization layers of a side shield structure, and to the lower scissor free layer via dipole field coupling through a notch in the lower magnetic shield, according to one embodiment.

Referring now to FIG. 7, a media facing side view of a magnetic read head 700 is shown in accordance with one embodiment. As an option, the magnetic read head 700 may be implemented in conjunction with features from any other embodiment listed herein, such as those described with reference to the other FIGS. Of course, the magnetic read head 700 and others presented herein may be used in various applications and/or in permutations which may or may not be specifically described in the illustrative embodiments listed herein. For instance, the magnetic read head 700 may include more or less components than those shown in FIG. 7, in various approaches. Moreover, unless otherwise specified, one or more components of the magnetic read head 700 may be of conventional material(s), design, and/or fabricated using conventional techniques (e.g., sputtering, plating, ALD, CVD, etc.), as would become apparent to one skilled in the art upon reading the present disclosure.

It is important to note that FIG. 7 illustrates one variation of the embodiment of FIGS. 6A-6C. Accordingly, various components of FIG. 7 have common numbering with those of FIGS. 6A-6C.

As shown in FIG. 7, the magnetic read head 700 includes a sensor stack 602, comprising at least the following layers in the order recited relative to the track direction: a seed layer structure 612, a lower scissor free layer 604, a separation layer 608, an upper scissor free layer 606, and a capping layer structure 610. A side shield structure 618 comprising upper stabilization layers 620 is located on opposite sides of the upper scissor free layer 606 in the cross track direction. While not shown in FIG. 7, a magnetic bias structure (similar to the magnetic bias structure 636 described above in FIGS. 6B-6C) may be positioned behind the back edge of the sensor stack 602 in the stripe/element height direction.

As also shown in FIG. 7, the sensor stack 602 is sandwiched between a lower magnetic shield 702 and an upper magnetic shield 616 in the track direction. The upper magnetic shield 616 may include NiFe, CoFe, and other suitable magnetic materials as would become apparent to one having skill in the art upon reading the present disclosure. Additionally, the upper magnetic shield 616 may be directly exchange coupled to the upper stabilization layers 620 in approaches where the upper stabilization layers 620 comprise soft magnetic material(s). Accordingly, the upper magnetic shield 616 may have any of the laminated structures disclosed herein (see, e.g., FIGS. 11, 12 and 16). Moreover, in approaches where the upper stabilization layers 620 comprise hard magnetic material(s), a decoupling layer may be positioned at least between the upper stabilization layers 620 and the upper magnetic shield 616 in the track direction.

As further shown in FIG. 7, the lower magnetic shield 702 has a notch 704 extending in a direction from the upper surface 706 to the lower surface 708 of the lower magnetic shield 702. In various approaches, the depth, d, of the notch 704 may be in a range from about 1 nm to about 10 nm. In more approaches, the lower magnetic shield 702 may comprise NiFe, CoFe, and other suitable magnetic materials as would become apparent to one having skill in the art upon reading the present disclosure.

In preferred approaches, a decoupling layer may be positioned at least between the lower scissor free layer 604 and the lower magnetic shield 702 in a track direction. This decoupling layer may comprise alumina, or other suitable nonmagnetic material as known in the art. In some approaches, the seed layer structure 612 may be the decoupling layer.

As shown in FIG. 7, the upper stabilization layers 620 have a magnetization 628 oriented generally parallel to the media facing side of the magnetic read head 600. The upper and lower scissor free layers 604, 606 have magnetizations 642, 644 also oriented in a direction parallel with the media facing side. The magnetization 628 of the upper stabilization layers 620 tends to pull the magnetization 644 of the upper scissor free layer 606 in one direction parallel with the media facing side; whereas, the magnetization 710 of the notched lower magnetic shield 702 tends to orient the magnetization 642 of the lower scissor free layer 604 in an opposite direction parallel with the media facing side via dipole field coupling. As shown in FIG. 7, the magnetization 644 of the upper scissor free layer 606 should be in the same direction as the magnetization 628 of the upper stabilization layers 620, but in the opposite direction as the magnetization 642 of the lower scissor free layer 604. The stabilization of the upper scissor free layer 606 via the upper stabilization layers 620, and the stabilization of the lower scissor free layer 604 via the dipole field through the notch 704 in the lower magnetic shield 702 effectively prevents the magnetizations 642, 644 of the lower and upper scissor free layers 604, 606 from flipping direction.

As also shown in FIG. 7, each of the upper stabilization layers 620 may be separated from the notched lower magnetic shield 702 by an isolation layer 622, which may preferably be nonmagnetic and electrically insulating. Additionally, each of the upper stabilization layers 620 may be separated from the sensor stack 602 by an isolation layer 646, which may also preferably be nonmagnetic and electrically insulating.

Figure 8A:
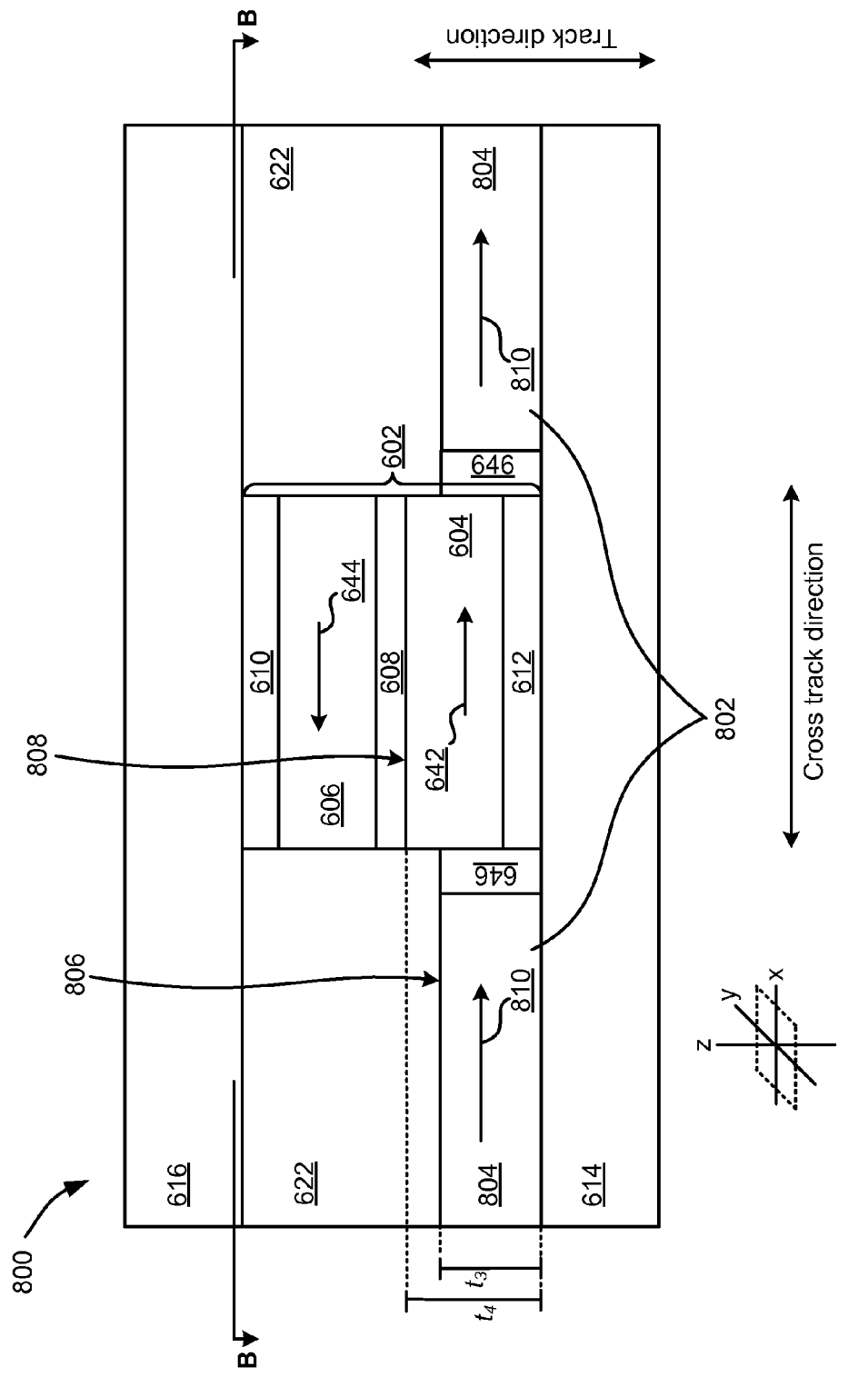
FIG. 8A is a media facing side view of a magnetic read head in which L-field stabilization is applied to the lower scissor free layer, according to one embodiment.

Referring now to the FIG. 8A-8B, various views of a magnetic read head 800 are shown in accordance with one embodiment. As an option, the magnetic read head 800 may be implemented in conjunction with features from any other embodiment listed herein, such as those described with reference to the other FIGS. Of course, the magnetic read head 800 and others presented herein may be used in various applications and/or in permutations which may or may not be specifically described in the illustrative embodiments listed herein. For instance, the magnetic read head 800 may include more or less components than those shown in FIGS. 8A-8B, in various approaches. Moreover, unless otherwise specified, one or more components of the magnetic read head 800 may be of conventional material(s), design, and/or fabricated using conventional techniques (e.g., sputtering, plating, ALD, CVD, etc.), as would become apparent to one skilled in the art upon reading the present disclosure.

It is important to note that FIGS. 8A-8B illustrate one variation of the embodiment of FIGS. 6A-6C. Accordingly, various components of FIGS. 8A-8B have common numbering with those of FIGS. 6A-6C.

As shown in the media facing side view of FIG. 8A, the magnetic read head 800 includes a sensor stack 602, comprising at least the following layers in the order recited relative to the track direction: a seed layer structure 612, a lower scissor free layer 604, a separation layer 608, an upper scissor free layer 606, and a capping layer structure 610. The sensor stack 602 is sandwiched between lower and upper magnetic shields 614, 616 in the track direction. While not shown in FIG. 8A, a magnetic bias structure (similar to the magnetic bias structure 636 described above in FIGS. 6B-6C) may be positioned behind the back edge of the sensor stack 602 in the stripe/element height direction.

As further shown in FIG. 8A, the magnetic read head 800 includes a side shield structure 802 comprising lower stabilization layers 804 located on opposite sides of the lower scissor free layer 604 in the cross track direction. Each of the lower stabilization layers 804 may be separated from the upper magnetic shield 616 by an isolation layer 622, which may preferably be nonmagnetic and electrically insulating in various approaches. Additionally, the lower stabilization layers 804 may each be separated from the sensor stack 602 by an isolation layer 646, which may also preferably be nonmagnetic and electrically insulating.

In some approaches, the upper surfaces 806 of the lower stabilization layers 804 may lie in substantially the same x-y plane. In preferred approaches, the upper surface 806 of at least one of the lower stabilization layers 804 may be below the x-y plane extending along a bottom surface 808 of the separation layer 608. In more preferred approaches, the upper surfaces 806 of both lower stabilization layers 804 may be below the x-y plane extending along the bottom surface 808 of the separation layer 608.

In additional approaches, at least one lower stabilization layer 804 may have a thickness, $t_3$, in a range from about 1 nm to about 10 nm. In various approaches, the thickness of at least one lower stabilization layer 804 may be less than the total thickness, $t_4$, of the lower portion of the sensor stack 602, where the lower portion of the sensor stack 602 includes all layers of the sensor stack that are below the separation layer 608, such as the lower scissor free layer 604 and the seed layer structure 612. In some approaches, the thickness of the lower scissor free layer 604 may be in a range from about 2 nm to about 10 nm, and the thickness of the seed layer structure 612 may be in a range from about 1 nm to about 6 nm. Accordingly, the total thickness of the lower portion of the sensor stack 602 may be in a range from about 3 nm to about 16 nm.

In further approaches, the width of each lower stabilization layer 804 in the cross track direction may be about equal to, or greater than, the width of the lower scissor free layer 604 in the cross track direction. In some approaches, the width of each lower stabilization layer 804 may be 2×, 3×, 4×, etc. of the width of the lower scissor free layer 606. The width of the lower scissor free layer 606 may be in a range from about 10 nm to about 50 nm in some approaches.

In one particular approach, the lower stabilization layers 804 may each comprise one or more soft magnetic materials, including, but not limited to, NiFe, CoFe, NiFeCr, CoNiFe, alloys thereof, and other such suitable soft magnetic materials having a low magnetic coercivity and a high magnetization saturation as known in the art. In approaches where the lower stabilization layers 804 each comprise one or more soft magnetic materials, the lower stabilization layers 804 may be directly exchanged coupled to the lower magnetic shield 614.

Figure 13:
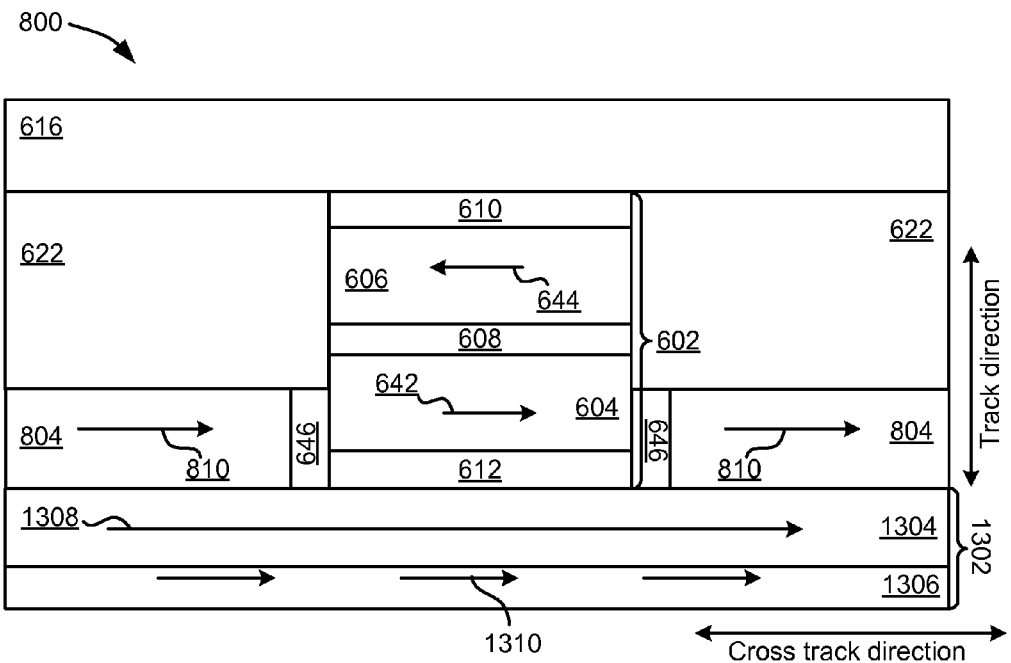
FIG. 13 is a media facing side view of the magnetic read head of FIG. 8A having a lower magnetic shield with a first laminated structure, according to one embodiment.

FIG. 13 provides one exemplary embodiment in which the magnetic read head 800 of FIG. 8A includes lower stabilization layers 804 comprised of soft magnetic material(s), and a lower magnetic shield 1302 that has a first laminated structure. As particularly shown in FIG. 13, the lower magnetic shield 1302 may include a lower magnetic shield layer 1304 (e.g., comprising CoFe, NiFeCr, CoNiFe, combinations and/or alloys thereof, etc.) and an AFM layer 1306 positioned therebelow in a track direction, where the lower magnetic shield layer 1304 and the AFM layer 1306 have magnetization 1308 and surface magnetization 1310, respectively, oriented in the same direction as the magnetization 810 of the lower stabilization layers 804. This lower magnetic shield layer 1304 and the lower stabilization layers 804 may comprise the same materials as one another, or may comprise one or more different materials having differing magnetic moments (Bs).

Figure 14:
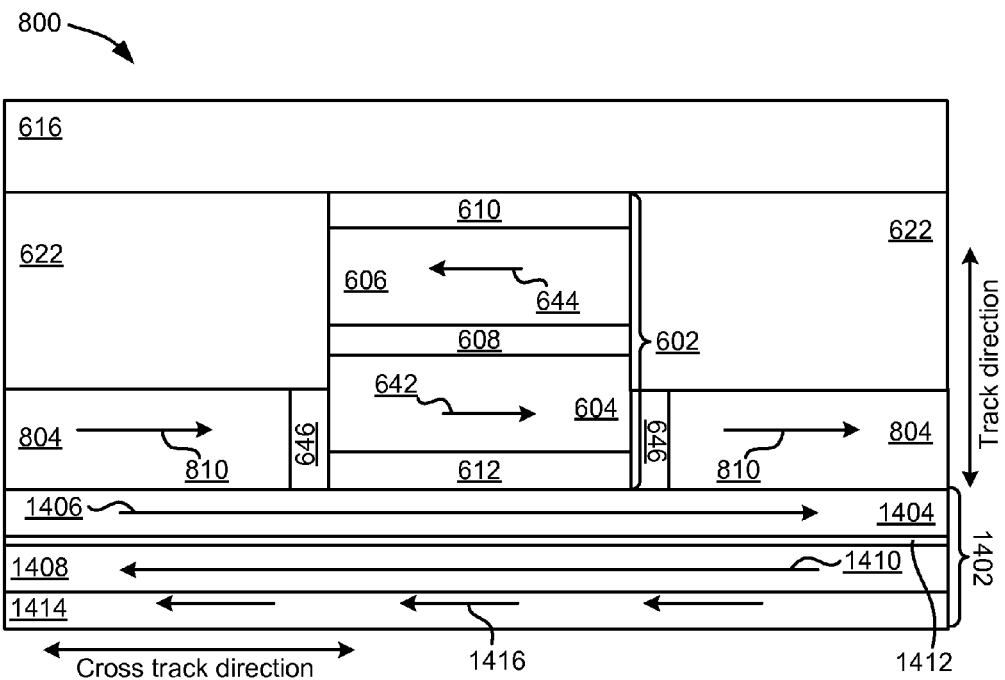
FIG. 14 is a media facing side view of the magnetic read head of FIG. 8A having a lower magnetic shield with a second laminated structure, according to one embodiment.

FIG. 14 provides another exemplary embodiment in which the magnetic read head 800 of FIG. 8A includes lower stabilization layers 804 comprised of soft magnetic material(s), and a lower magnetic shield 1402 that has a second laminated structure. As particularly shown in FIG. 14, the lower magnetic shield 1402 may include a first lower magnetic shield layer 1404 having a magnetization 1406, and a second lower magnetic shield layer 1408 having a magnetization 1410, where one or both of the lower magnetic shield layers 1404, 1408 may include CoFe, NiFeCr, CoNiFe, combinations and/or alloys thereof, etc. At least one of the lower magnetic shield layers 1404, 1408 and the lower stabilization layers 804 may comprise the same materials as one another, or may comprise one or more different materials having differing magnetic moments (Bs).

As also shown in FIG. 14, the lower magnetic shield layers 1404, 1408 are anti-ferromagnetically coupled across a nonmagnetic layer 1412 (e.g., comprising Ru). The lower magnetic shield 1402 may additionally include an AFM layer 1414 that has a surface magnetization 1416, and is positioned below the second lower magnetic shield layer 1408.

With continued reference to FIG. 8A, in another particular approach, the lower stabilization layers 804 may each comprise one or more hard magnetic materials, including, but not limited to, CoPt, CoCrPt, alloys thereof, and other such suitable hard magnetic materials having a high magnetic coercivity and a high magnetization saturation as known in the art. In approaches where the lower stabilization layers 804 each comprise one or more hard magnetic materials, the lower stabilization layers 804 are preferably magnetically decoupled from the lower magnetic shield 614. Accordingly, in such approaches, a decoupling layer may be positioned at least between the lower stabilization layers 804 and the lower magnetic shield 614 in the track direction. This decoupling may comprise alumina, or other suitable nonmagnetic material as known in the art.

As shown in the embodiment of FIG. 8A, the lower stabilization layers 804 have a magnetization 810 oriented generally parallel to the media facing side of the magnetic read head 800. The magnetization 810 of the lower stabilization layers 804 tends to pull the magnetization 642 of the lower scissor free layer 604 in one direction parallel with the media facing side, while the magnetization 644 of the upper scissor free layer 606 remains oriented in an opposite direction that is also parallel with the media facing side due to the magnetostatic or dipole field coupling of the lower and upper scissor free layers 604, 606. As shown in FIG. 8A, the magnetization 642 of the lower scissor free layer 604 should be in the same direction as the magnetization 810 of the lower stabilization layers 804, but in the opposite direction as the magnetization 644 of the upper scissor free layer 606. The stabilization of the lower scissor free layer 604 via the lower stabilization layer 804 prevents the magnetizations 642, 644 of the lower and upper scissor free layers 604, 606 from flipping direction and improves the stability of the magnetic read head 800.

The L-field stabilization of the lower scissor free layer 604 via the lower stabilization layers 804 may be further seen in the top down view of a simplified schematic of the magnetic read head 800 as seen from line B-B in FIG. 8A. Note that the capping layer structure 610 positioned above the upper scissor free layer 606 in the track direction, and which may also be positioned above one or more portions of the magnetic bias structure 636, is not shown in FIG. 8B.

Figure 9:
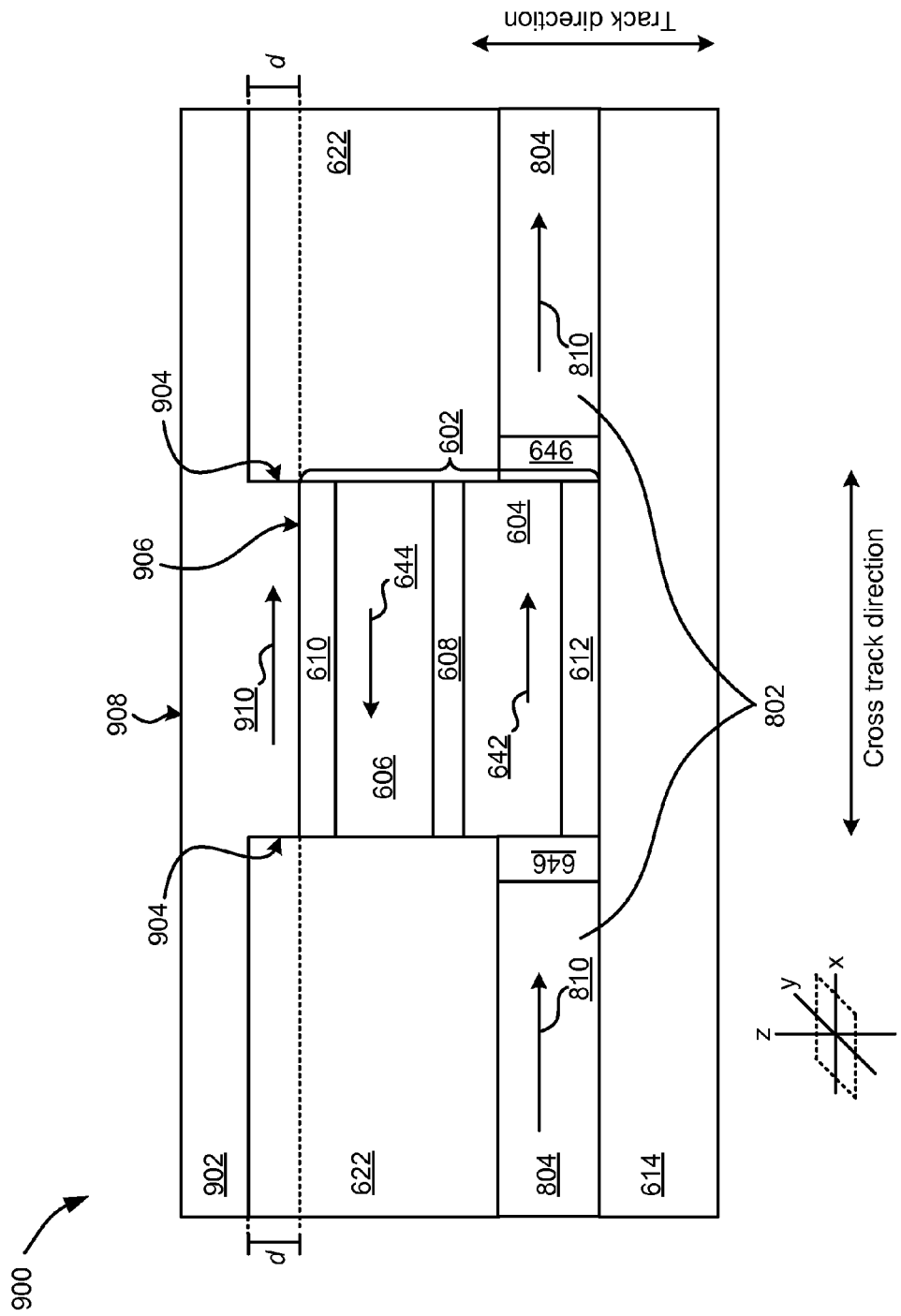
FIG. 9 is a media facing side view of a magnetic read head in which L-field stabilization is applied to the lower scissor free layer via the lower stabilization layers of a side shield structure, and to the upper scissor free layer via dipole field coupling through a notch in the upper magnetic shield, according to one embodiment.

Referring now to FIG. 9, a media facing side view of a magnetic read head 900 is shown in accordance with one embodiment. As an option, the magnetic read head 900 may be implemented in conjunction with features from any other embodiment listed herein, such as those described with reference to the other FIGS. Of course, the magnetic read head 900 and others presented herein may be used in various applications and/or in permutations which may or may not be specifically described in the illustrative embodiments listed herein. For instance, the magnetic read head 900 may include more or less components than those shown in FIG. 9, in various approaches. Moreover, unless otherwise specified, one or more components of the magnetic read head 900 may be of conventional material(s), design, and/or fabricated using conventional techniques (e.g., sputtering, plating, ALD, CVD, etc.), as would become apparent to one skilled in the art upon reading the present disclosure.

It is important to note that FIG. 9 illustrates one variation of the embodiments of FIGS. 6A-6C, 7 and 8. Accordingly, various components of FIG. 9 have common numbering with those of FIGS. 6A-6C, 7 and 8.

As shown in FIG. 9, the magnetic read head 900 includes a sensor stack 602, comprising at least the following layers in the order recited relative to the track direction: a seed layer structure 612, a lower scissor free layer 604, a separation layer 608, an upper scissor free layer 606, and a capping layer structure 610. A side shield structure 802 comprising lower stabilization layers 804 is located on opposite sides of the lower scissor free layer 604 in the cross track direction. While not shown in FIG. 9, a magnetic bias structure (similar to the magnetic bias structure 636 described above in FIGS. 6B-6C) may be positioned behind the back edge of the sensor stack 602 in the stripe/element height direction.

As also shown in FIG. 9, the sensor stack 602 is sandwiched between a lower magnetic shield 614 and an upper magnetic shield 902 in the track direction. The lower magnetic shield 614 may include NiFe, CoFe, and other suitable magnetic materials as would become apparent to one having skill in the art upon reading the present disclosure. Additionally, the lower magnetic shield 614 may be directly exchange coupled to the lower stabilization layers 804 in approaches where the lower stabilization layers 804 comprise soft magnetic material(s). Accordingly, the lower magnetic shield 614 may have any of the laminated structures disclosed herein (see, e.g., FIGS. 13, 14 and 16). Moreover, in approaches where the lower stabilization layers 804 comprise hard magnetic material(s), a decoupling layer may be positioned at least between the lower stabilization layers 804 and the lower magnetic shield 614 in the track direction.

As further shown in FIG. 9, the upper magnetic shield 902 has a notch 904 extending in a direction from the lower surface 906 to the upper surface 908 of the upper magnetic shield 902. In various approaches, the depth, d, of the notch 904 may be in a range from about 1 nm to about 10 nm. In more approaches, the upper magnetic shield 902 may comprise NiFe, CoFe, and other suitable magnetic materials as would become apparent to one having skill in the art upon reading the present disclosure.

In preferred approaches, a decoupling layer (not shown in FIG. 9) may be positioned at least between the upper scissor free layer 606 and the notched upper magnetic shield 902 in a track direction. This decoupling layer may comprise alumina, or other suitable nonmagnetic material as known in the art.

As shown in FIG. 9, the lower stabilization layers 804 have a magnetization 810 oriented generally parallel to the media facing side of the magnetic read head 900. The magnetization 810 of the lower stabilization layers 804 tends to pull the magnetization 642 of the lower scissor free layer 604 in one direction parallel with the media facing side; whereas, the magnetization 910 of the notched upper magnetic shield 902 tends to orient the magnetization 644 of the upper scissor free layer 606 in an opposite direction parallel with the media facing side via dipole field coupling. As shown in FIG. 9, the magnetization 642 of the lower scissor free layer 604 should be in the same direction as the magnetization 810 of the lower stabilization layers 804, but in the opposite direction as the magnetization 644 of the upper scissor free layer 606. The stabilization of the lower scissor free layer 604 via the lower stabilization layers 804, and the stabilization of the upper scissor free layer 606 via the dipole field through the notch 904 in the upper magnetic shield 902 effectively prevents the magnetizations 642, 644 of the lower and upper scissor free layers 604, 606 from flipping direction.

As also shown in FIG. 9, each of the lower stabilization layers 804 may be separated from the notched upper magnetic shield 902 by an isolation layer 622, which may preferably be nonmagnetic and electrically insulating. Additionally, the lower stabilization layers 804 may each be separated from the sensor stack 602 by an isolation layer 646, which may also preferably be nonmagnetic and electrically insulating.

Figure 10A:
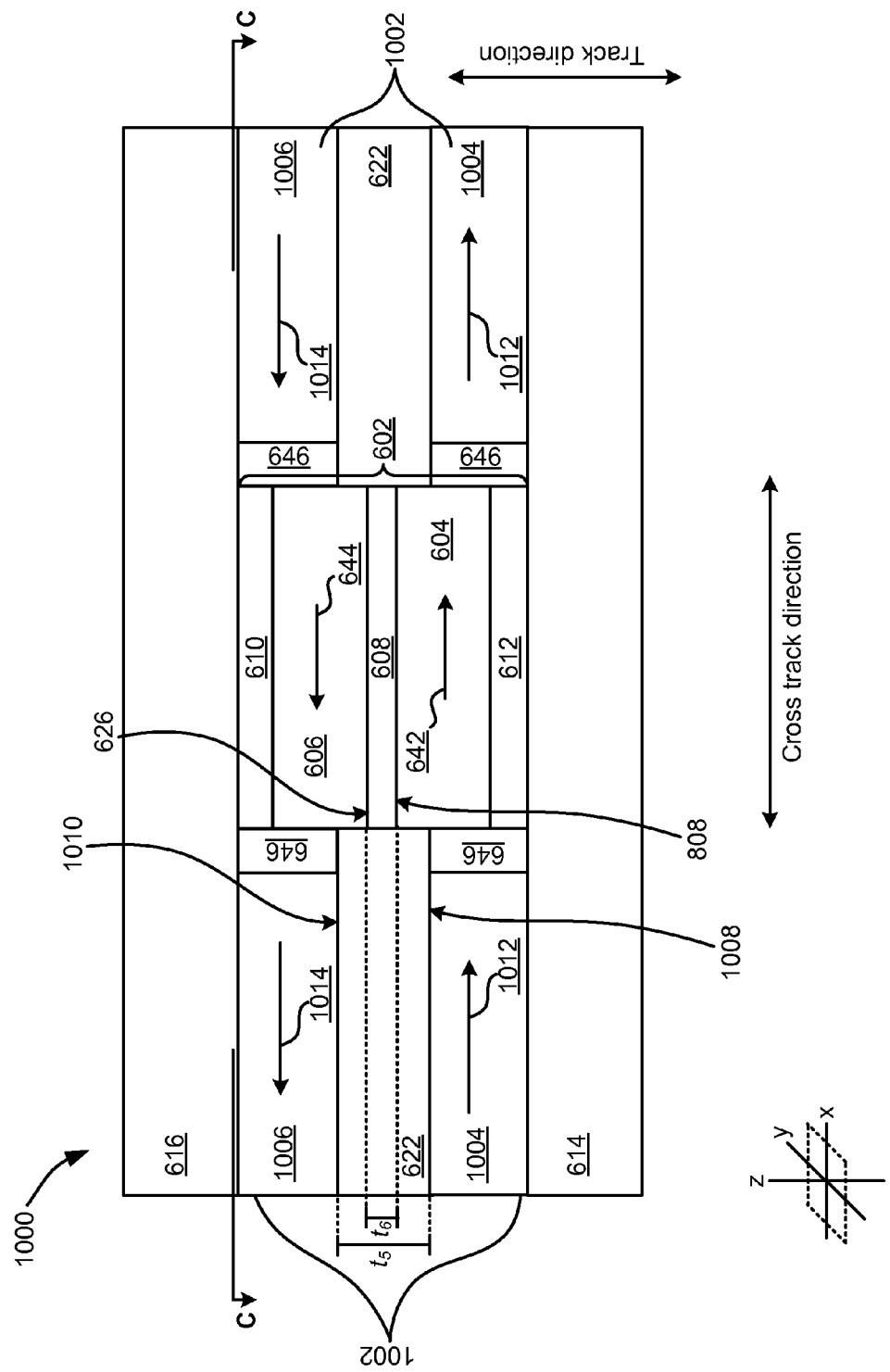
FIG. 10A is a media facing side view of a magnetic read head in which L-field stabilization is applied to the lower and upper scissor free layers, according to one embodiment.

Referring now to the FIGS. 10A-10B, various views of a magnetic read head 1000 are shown in accordance with one embodiment. As an option, the magnetic read head 1000 may be implemented in conjunction with features from any other embodiment listed herein, such as those described with reference to the other FIGS. Of course, the magnetic read head 1000 and others presented herein may be used in various applications and/or in permutations which may or may not be specifically described in the illustrative embodiments listed herein. For instance, the magnetic read head 1000 may include more or less components than those shown in FIGS. 10A-10B, in various approaches. Moreover, unless otherwise specified, one or more components of the magnetic read head 1000 may be of conventional material(s), design, and/or fabricated using conventional techniques (e.g., sputtering, plating, ALD, CVD, etc.), as would become apparent to one skilled in the art upon reading the present disclosure.

It is important to note that FIGS. 10A-10B illustrate one variation of the embodiments of FIGS. 6A-6C and 8. Accordingly, various components of FIGS. 10A-10B have common numbering with those of FIGS. 6A-6C and 8.

As shown in the media facing side view of FIG. 10A, the magnetic read head 1000 includes a sensor stack 602, comprising at least the following layers in the order recited relative to the track direction: a seed layer structure 612, a lower scissor free layer 604, a separation layer 608, an upper scissor free layer 606, and a capping layer structure 610. The sensor stack 602 is sandwiched between lower and upper magnetic shields 614, 616 in the track direction. While not shown in FIG. 10A, a magnetic bias structure (similar to the magnetic bias structure 636 described above in FIGS. 6B-6C) may be positioned behind the back edge of the sensor stack 602 in the stripe/element height direction.

As further shown in FIG. 10A, the magnetic read head 1000 includes a side shield structure 1002 configured to provide independent L-field stabilizations of the upper and lower scissor free layers 604, 606. The side shield structure 1002 comprises: lower stabilization layers 1004 located on opposite sides of the lower scissor free layer 604 in the cross track direction, and upper stabilization layers 1006 located on opposite sides of the upper scissor free layer 606. An isolation layer 622 may be positioned between the lower and upper stabilization layers 1004, 1006. An additional isolation layer 646 may separate the lower and upper stabilization layers 1004, 1006 from the sensor stack 602. The isolation layers 622, 646 may preferably be nonmagnetic and electrically insulating in various approaches.

In some approaches, the upper surfaces 1008 of the lower stabilization layers 1004 may lie in substantially the same x-y plane. In preferred approaches, the upper surface 1008 of at least one of the lower stabilization layers 1004 may be below the x-y plane extending along a bottom surface 808 of the separation layer 608. In more preferred approaches, the upper surfaces 1008 of both lower stabilization layers 1004 may be below the x-y plane extending along the bottom surface 808 of the separation layer 608.

In various approaches, the lower surfaces 1010 of the upper stabilization layers 1006 may lie in substantially the same x-y plane. In preferred approaches, the lower surface 1010 of at least one of the upper stabilization layers 1006 may be above the x-y plane extending along a top surface 626 of the separation layer 608. In more preferred approaches, the lower surfaces 1010 of both upper stabilization layers 1006 may be above the x-y plane extending along the top surface 626 of the separation layer 608.

In further approaches, the width of each lower and/or upper stabilization layer 1004, 1006 in the cross track direction may be about equal to, or greater than, the width of one of the scissor free layers in the cross track direction. In yet more approaches, the width of each lower and/or upper stabilization layer 1004, 1006 may be 2×, 3×, 4×, etc. of the width of one of the scissor free layers.

In additional approaches, the thickness, $t_5$, of the isolation layer 622 between the lower and upper stabilization layers 1004, 1006 may be about equal to, or greater than, the thickness, $t_6$, of the separation layer 608. Approaches in which the thickness, $t_5$, of the isolation layer 622 is about equal to the thickness, $t_6$, of the separation layer 608 may result in greater process and head performance variations as compared to approaches where the thickness, $t_5$, of the isolation layer 622 is greater than the thickness, $t_6$, of the separation layer 608. Accordingly, in preferred approaches, the thickness, $t_5$, of the isolation layer 622 is greater than the thickness, $t_6$, of the separation layer 608. In particular approaches, the thickness, $t_5$, of the isolation layer 622 be in a range from about 2 nm to about 10 nm, and the thickness of the separation layer 608, as measured in a track direction, may be in a range from about 0.5 nm to about 1 nm.

In some approaches, the lower and upper stabilization layers 1004, 1006 may each comprise one or more soft magnetic materials, including, but not limited to, NiFe, CoFe, NiFeCr, CoNiFe, alloys thereof, and other such suitable soft magnetic materials having a low magnetic coercivity and a high magnetization saturation as known in the art. The lower and upper stabilization layers 1004, 1006 may comprise the same soft magnetic materials as one another, or may comprise one or more different materials having differing magnetic moments (Bs). In approaches where the lower and upper stabilization layers 1004, 1006 each comprise one or more soft magnetic materials, the lower stabilization layer 1004 may be directly exchange coupled to the lower magnetic shield 614, and the upper stabilization layers 1006 may be directly exchanged coupled to the upper magnetic shield 616. Accordingly, the upper magnetic shield 616 and/or the lower magnetic shield 614 may have any of the laminated structures disclosed herein (see, e.g., FIGS. 11-16) Additionally, in such approaches where the lower and/or upper stabilization layers 1004, 1006 comprise one or more soft magnetic materials, the lower stabilization layers 1004 may be in direct contact to the lower magnetic shield 614 and/or the upper stabilization layer 1006 may be in direct contact to the upper magnetic shield 616 via a novel junction milling/refilling process, described in greater detail in FIGS. 19A-19K.

Figure 15:
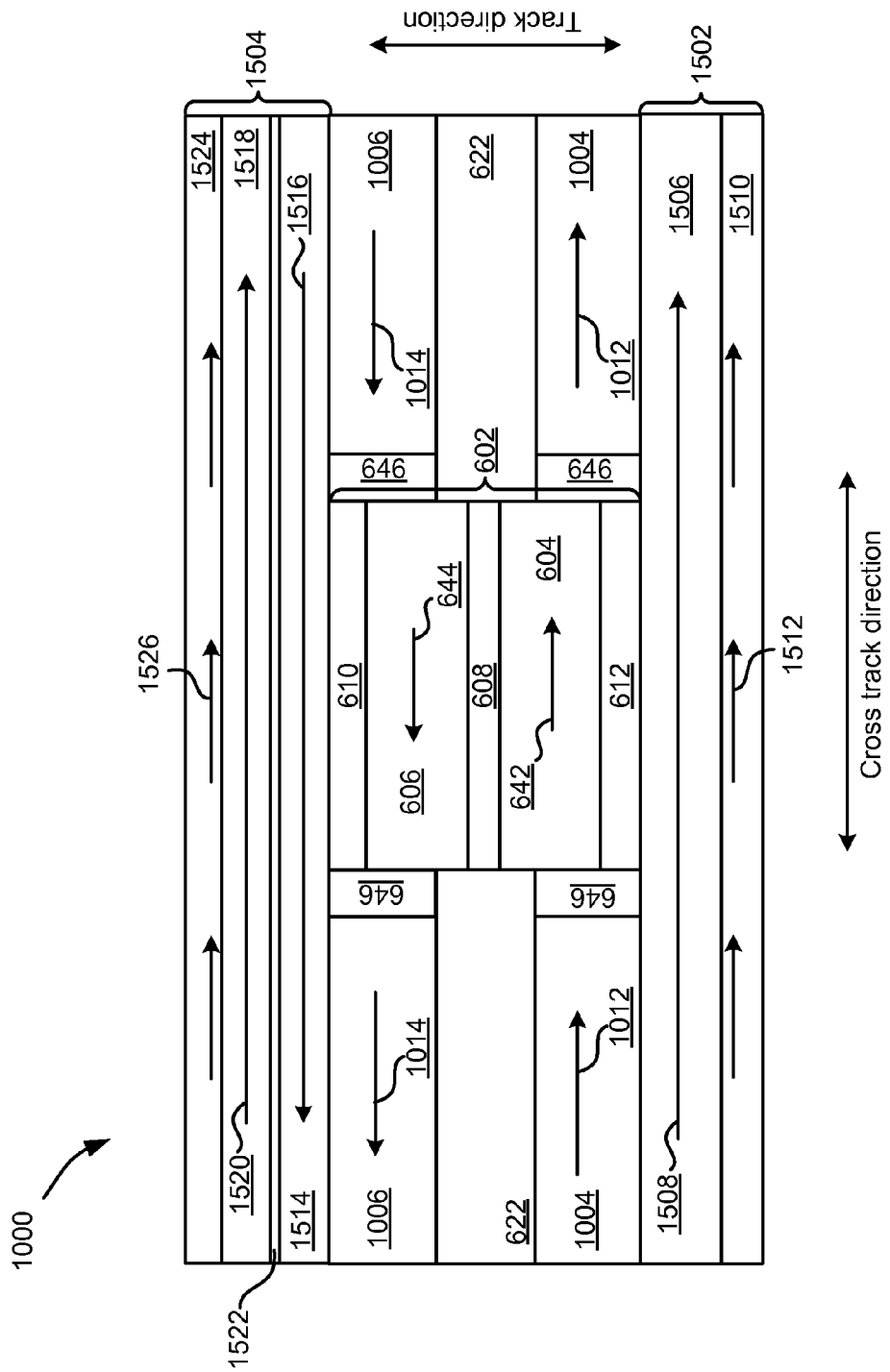
FIG. 15 is a media facing side view of the magnetic read head of FIG. 10A having a lower magnetic shield with a first laminated structure, and an upper magnetic shield with a second laminated structure, according to one embodiment.

FIG. 15 provides one exemplary embodiment in which the magnetic read head 1000 of FIG. 10A includes lower and upper stabilization layers 1004, 1006 comprised of soft magnetic material(s), a lower magnetic shield 1502 having a first laminated structure, and an upper magnetic shield 1504 having a second laminated structure. It is important to note with reference to FIG. 15, that the lower magnetic shield 1502 may have the second laminated structure, whereas the upper magnetic shield 1504 may have the first laminated structure in other approaches. In general, the surface magnetizations (1512 and 1526) of lower and upper AFM layers (1510 and 1524) should be in the same direction so that the two AFM layers can be annealed in one annealing process.

As particularly shown in FIG. 15, the lower magnetic shield 1502 may include a first lower magnetic shield layer 1506 having a magnetization 1508, and an AFM layer 1510 having a magnetization 1512 positioned therebelow in the track direction.

As also shown in FIG. 15, the upper magnetic shield 1504 may include a first upper magnetic shield layer 1514 having a magnetization 1516, and a second upper magnetic shield layer 1518 having a magnetization 1520, where the magnetic shield layers 1514, 1518 are anti-ferromagnetically coupled across a nonmagnetic layer 1522 (e.g., comprising Ru). The upper magnetic shield 1504 additionally includes an AFM layer 1524 that has a surface magnetization 1526, and is positioned above the second upper magnetic shield layer 1518.

Figure 16:
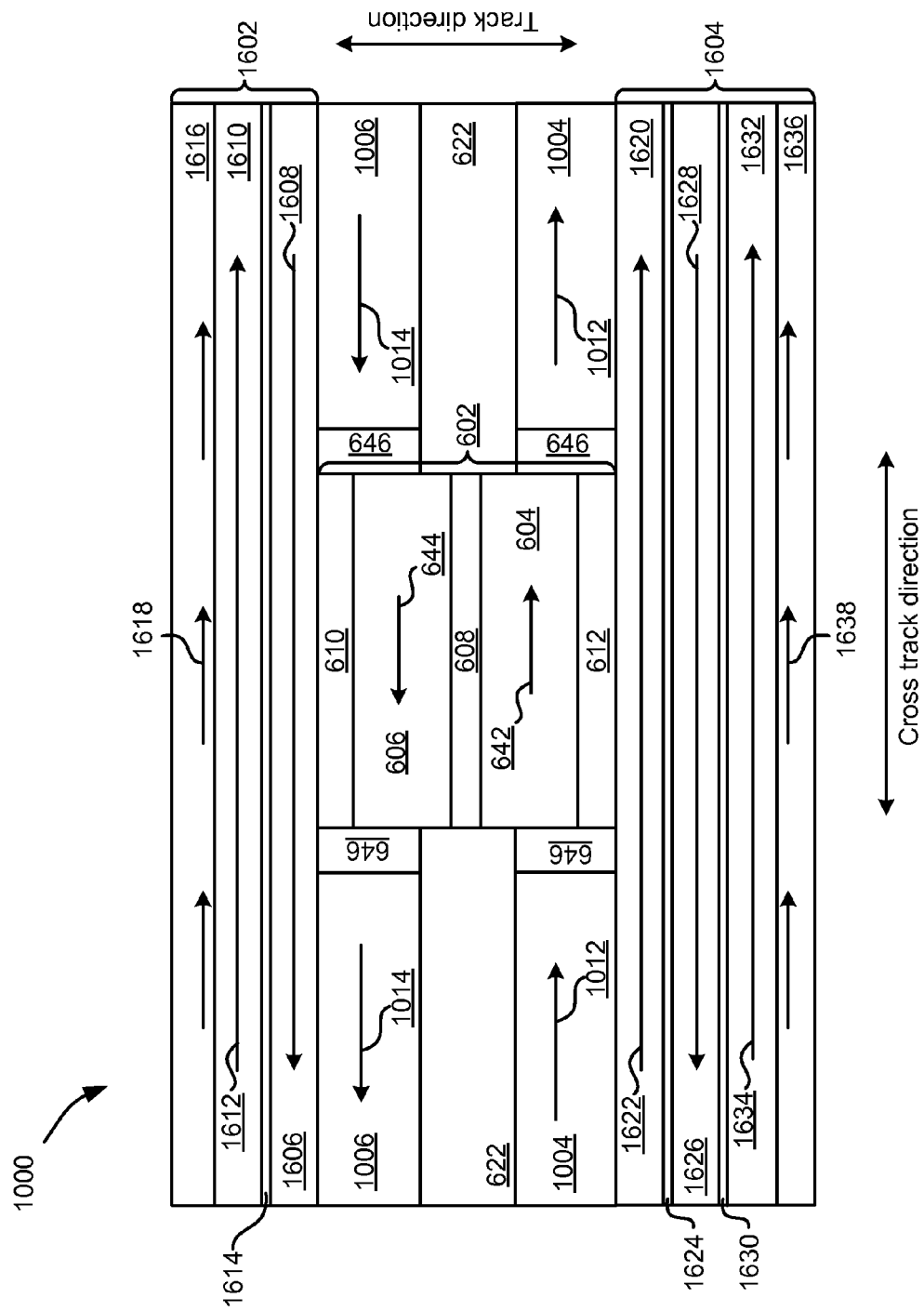
FIG. 16 is a media facing side view of the magnetic read head of FIG. 10A having an upper magnetic shield with a second laminated structure, and a lower magnetic shield with a third laminated structure, according to one embodiment.

FIG. 16 provides another exemplary embodiment in which the magnetic read head 1000 of FIG. 10A includes lower and upper stabilization layers 1004, 1006 comprised of soft magnetic material(s), an upper magnetic shield 1602 having a second laminated structure (as discussed above), and a lower magnetic shield 1604 having a third laminated structure. It is important to note with reference to FIG. 16, that the upper magnetic shield 1602 may have the third laminated structure, whereas the lower magnetic shield 1604 may have the second laminated structure in other approaches. As particularly shown in FIG. 16, the upper magnetic shield 1602 may include a first upper magnetic shield layer 1606 having a magnetization 1608, and a second upper magnetic shield layer 1610 having a magnetization 1612, where the upper magnetic shield layers 1606, 1610 are anti-ferromagnetically coupled across a nonmagnetic layer 1614 (e.g., comprising Ru). The upper magnetic shield 1602 additionally includes an AFM layer 1616 that has a surface magnetization 1618, and is positioned above the second upper magnetic shield layer 1610.

As also shown in FIG. 16, the lower magnetic shield 1604 may include the following layers in order: a first lower magnetic shield layer 1620 having a magnetization 1622; a first nonmagnetic layer 1624 (e.g., comprising Ru); a second lower magnetic shield layer 1626 having a magnetization 1628; a second nonmagnetic layer 1630 (e.g., comprising Ru); a third lower magnetic shield layer 1632 having a magnetization 1634; and an AFM layer 1636 having a surface magnetization 1638.

With continued reference to FIG. 10A, in other approaches, the lower and upper stabilization layers 1004, 1006 may each comprise one or more hard magnetic materials, including, but not limited to, CoPt, CoCrPt, alloys thereof, and other such suitable hard magnetic materials having a high magnetic coercivity and a high magnetization saturation as known in the art. The lower and upper stabilization layers 1004, 1006 may comprise the same hard magnetic materials as one another, or may comprise one or more different hard magnetic materials. In approaches where the lower and upper stabilization layers 1004, 1006 each comprise one or more hard magnetic materials, the lower and upper stabilization layers 1004, 1006 are preferably magnetically decoupled from the lower and upper magnetic shields 614, 616, respectively. Accordingly, in such approaches, a decoupling layer may be positioned at least between the lower stabilization layers 1004 and the lower magnetic shield 614 in the track direction, as well as between the upper stabilization layers 1006 and the upper magnetic shield 616. This decoupling layer may comprise alumina, or other suitable nonmagnetic material as known in the art.

In more approaches, the upper stabilization layers 1006 may comprise one or more soft magnetic materials, whereas the lower stabilization layers 1004 may comprise one or more hard magnetic materials. In such an approach, the upper stabilization layers 1006 may be directly exchange coupled to the upper magnetic shield 616; thus, the upper magnetic shield 616 may have any of the laminated structures disclosed herein (see, e.g., FIGS. 11, 12 and 16) or any other suitable structure as would become apparent to one having skill in the art upon reading the present disclosure. Moreover, the lower stabilization layer 1004 may be magnetically decoupled from the lower magnetic shield 614 (e.g., via a decoupling layer present between the lower stabilization layers 1004 and the lower magnetic shield 614).

Figure 17:
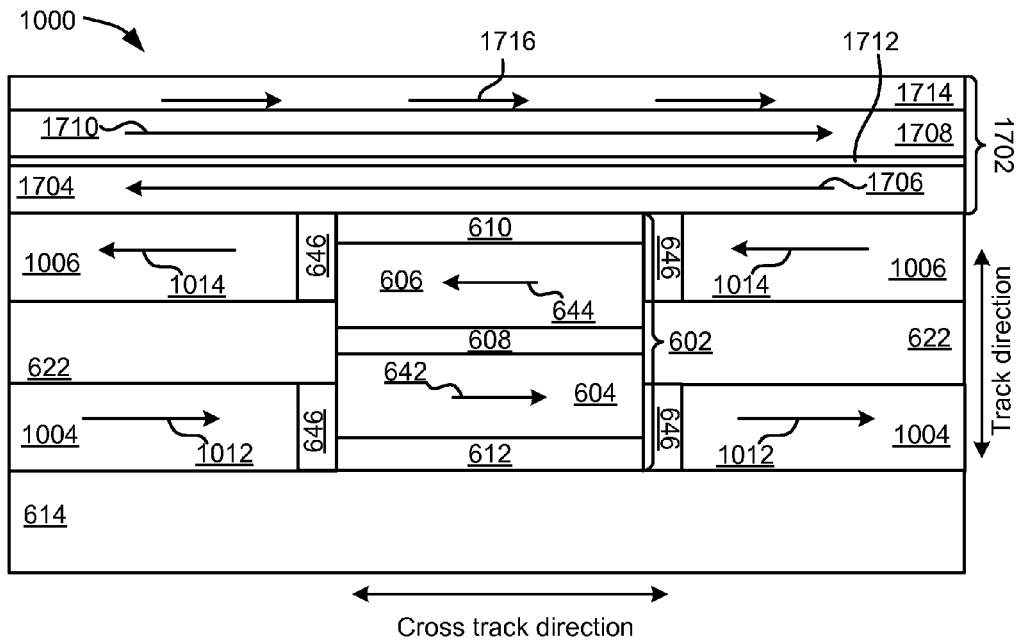
FIG. 17 is a media facing side view of the magnetic read head of FIG. 10A having an upper magnetic shield with a second laminated structure, according to one embodiment.

FIG. 17 provides one exemplary embodiment in which the magnetic read head 1000 of FIG. 10A includes lower stabilization layers 1004 comprised of hard magnetic material(s), upper stabilization layers 1006 comprised of soft magnetic material(s), and an upper magnetic shield 1702 having the aforementioned second laminated structure.

As particularly shown in FIG. 17, the upper magnetic shield 1702 may include a first upper magnetic shield layer 1704 having a magnetization 1706, and a second upper magnetic shield layer 1708 having a magnetization 1710, where the upper magnetic shield layers 1704, 1708 are anti-ferromagnetically coupled across a nonmagnetic layer 1712 (e.g., comprising Ru). The upper magnetic shield 1702 additionally includes an AFM layer 1714 that has a surface magnetization 1716, and is positioned above the second upper magnetic shield layer 1708.

Again with reference to FIG. 10A, in yet more approaches, the lower stabilization layers 1004 may comprise one or more soft magnetic materials, whereas the upper stabilization layers 1006 may comprise one or more hard magnetic materials.

In such an approach, the lower stabilization layers 1004 may be directly exchange coupled to the lower magnetic shield 614; thus, the lower magnetic shield 614 may have any of the laminated structures disclosed herein (see, e.g., FIGS. 13, 14 and 16) or any other suitable structure as would become apparent to one having skill in the art upon reading the present disclosure. Moreover, the upper stabilization layer 1006 may be magnetically decoupled from the upper magnetic shield 616 (e.g., via a decoupling layer present between the upper stabilization layers 1006 and the upper magnetic shield 616).

Figure 18:
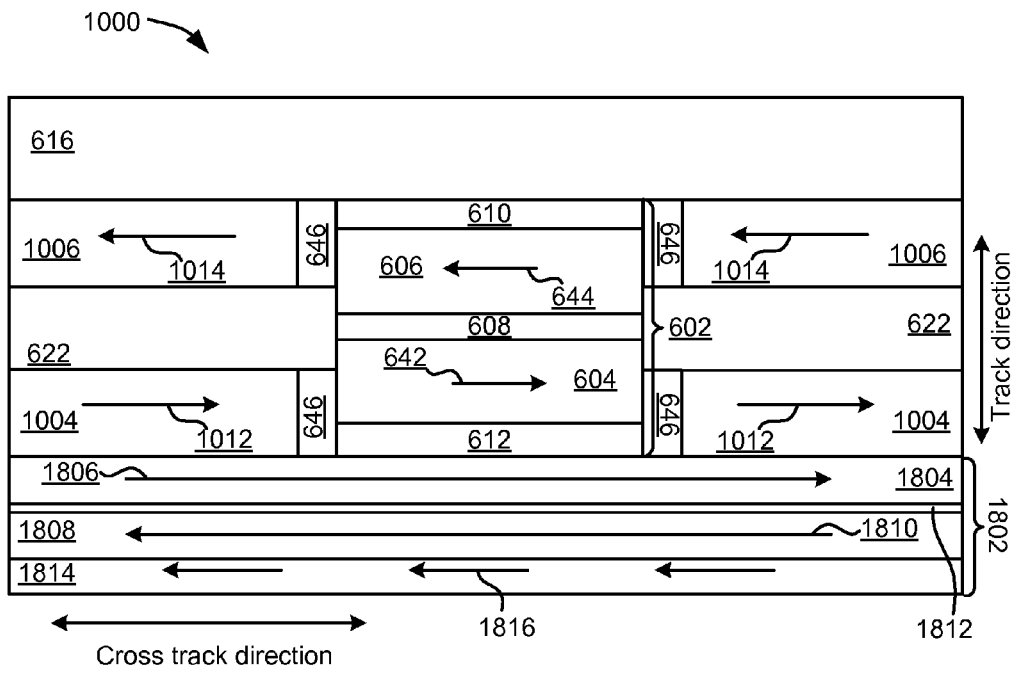
FIG. 18 is a media facing side view of the magnetic read head of FIG. 10A having a lower magnetic shield with a second laminated structure, according to one embodiment.

FIG. 18 provides one exemplary embodiment in which the magnetic read head 1000 of FIG. 10A includes lower stabilization layers 1004 comprised of soft magnetic material(s), upper stabilization layers 1006 comprised of hard magnetic material(s), and a lower magnetic shield 1802 having the aforementioned second laminated structure. For instance, as particularly shown in FIG. 18, the lower magnetic shield 1802 may include a first lower magnetic shield layer 1804 having a magnetization 1806, and a second lower magnetic shield layer 1808 having a magnetization 1810, where the lower magnetic shield layers 1804, 1808 are anti-ferromagnetically coupled across a nonmagnetic layer 1812 (e.g., comprising Ru). The lower magnetic shield 1802 additionally includes an AFM layer 1814 that has a surface magnetization 1816, and is positioned below the second lower magnetic shield layer 1808.

Again with reference to FIG. 10A, the magnetization 1012 of the lower stabilization layers 1004 tends to pull the magnetization 642 of the lower scissor free layer 604 in one direction parallel with the media facing side, while the magnetization 1014 of the upper stabilization layers 1006 tends to pull the magnetization 644 of the upper scissor free layer 606 in the opposite direction parallel with the media facing side. This arrangement again prevents the magnetizations 642, 644 of the lower and upper scissor free layer 604, 606 from flipping direction and improves the reliability of the magnetic read head 1000.

The independent L-field stabilization of the lower scissor free layer 604 via the lower stabilization layers 1004 and the L-field stabilization of the upper scissor free layer 606 via the upper stabilization layers 1006 may be further seen in the top down view of a simplified schematic of the magnetic read head 1000 as seen from line C-C in FIG. 10A. Note that the capping layer structure 610 positioned above the upper scissor free layer 606 in the track direction, and which may also be positioned above one or more portions of the magnetic bias structure 636, is not shown in FIG. 10B.

Referring now to FIGS. 19A-19K, a novel junction milling/refilling process for forming a side shield structure of a magnetic read head is shown using a media facing side view of the magnetic read head in various stages of formation, according to one embodiment. As an option, the present process may be implemented to construct structures such as those shown in the other figures. Of course, the present method and others presented herein may be used to form magnetic structures for a wide variety of devices and/or purposes which may or may not be related to magnetic recording. It should be noted that the features disclosed herein may be used in any of the embodiments described in accordance with the various methods. It should also be noted that the present method may include more or less steps than those described and/or illustrated in FIGS. 19A-19K, according to various approaches. Further, the present method and others presented herein may be carried out in any desired environment.

Figure 19A:
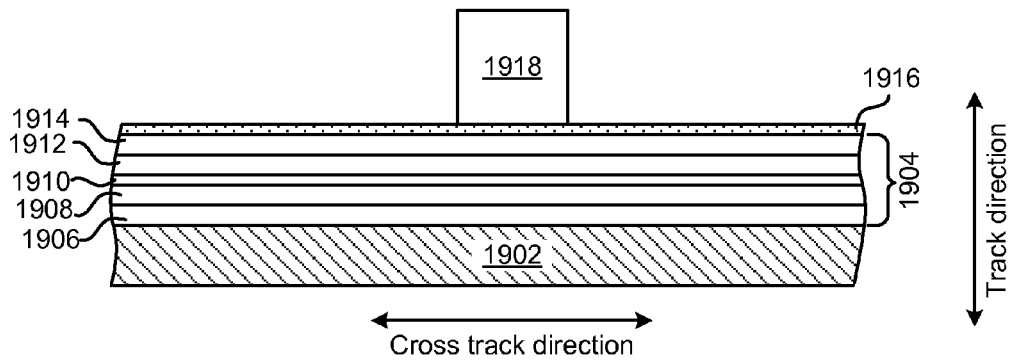
FIGS. 19A-19K are media facing side views of a magnetic read head in various stages of formation in order to illustrate a novel junction milling/refilling process for forming the magnetic read head, and particularly the side shield structure thereof, according to one embodiment.

As shown in FIG. 19A, a sensor stack 1904 is formed above a lower magnetic shield 1902. The lower magnetic shield 1902 may comprise one or more magnetic materials having a high magnetic permeability (g) to provide effective magnetic shielding. In particular approaches, the lower magnetic shield 1902 may comprise one or more layers, where each layer may independently include NiFe, and/or CoFe, and/or other suitable magnetic materials as would become apparent to one having skill in the art upon reading the present disclosure.

The sensor stack 1904 may include a seed layer structure 1906, a lower scissor free layer 1908, a separation layer 1910, an upper scissor free layer 1912, and a capping layer structure 1914.

The seed layer structure 1906 may be configured to promote a desired grain growth and magnetism in the above formed layers. In various approaches, the seed layer structure 1906 may comprise one or more layers, where each layer may independently include at least one of NiTa, CrMo, Ti, W, etc.

The lower and upper scissor free layers 1908, 1912 are magneto-statically coupled across the separation layer 1910, in addition to the orange peel coupling. In various approaches, the lower scissor free layer 1908 and/or the upper scissor free layer 1912 may comprise one or more layers of magnetic material. Exemplary magnetic materials may include, but are not limited to, Ni, Fe, Co, Hf, B, and combinations thereof. In some approaches, the separation layer 1910 may be non-magnetic and electrically insulating. Suitable materials for the separation layer 1910 may include, but are not limited to, at least one of MgO, $TiO_2$, AlO, alumina, AgSn, etc.

The capping layer structure 1914 may be configured to protect the layers positioned therebelow from damage during manufacture. In preferred approaches, the capping layer structure 1914 may be non-magnetic. For instance, in some approaches the capping layer structure 1914 may comprise one or more layers, where each layer may independently include at least one suitable nonmagnetic material such as Ru, Ta, Cr, etc.

While not shown in FIG. 19A, a magnetic bias structure extends behind the back edge of the sensor stack 1904 in a direction away from the MFS. The capping layer structure 1914 positioned above the upper scissor free layer 1912 in the track direction may also be positioned above one or more portions of this magnetic bias structure.

Again with reference to FIG. 19A, an optional nonmagnetic spacer layer 1916 may be positioned above the capping layer structure 1914 and/or the aforementioned magnetic bias structure. The nonmagnetic spacer layer 1916 may comprise any suitable material known in the art, such as Ru, Ir, etc., and may configured to decouple the sensor stack 1904 and the magnetic bias structure from a later formed upper magnetic shield.

As also shown in FIG. 19A, a mask 1918 is deposited over a portion of the sensor stack 1904. The mask 1918 includes edges that define the width of the sensor stack 1904 in the cross track direction. The mask 1918 may be formed of a photolithographically patterned photoresist material, and may also include other layers such as one or more hard mask layers (e.g., comprising diamond like carbon (DLC) or amorphous carbon), an image transfer layer (e.g., comprising a soluble polyimide material), a bottom anti-reflective coating layer (BARC) etc.

Figure 19B:
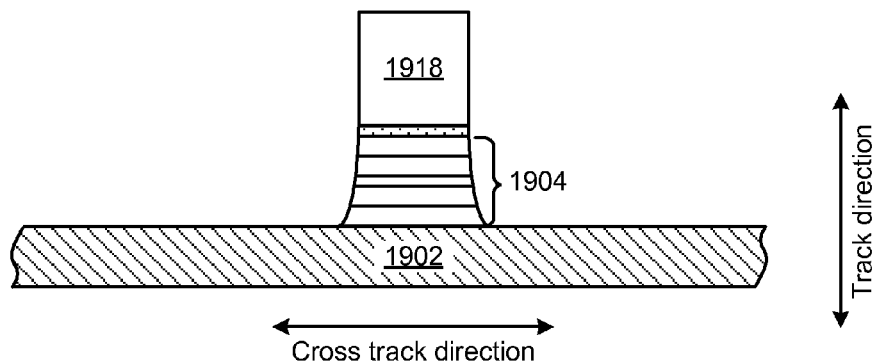

As shown in FIG. 19B, material not protected by the mask 1918 is removed via a first removal process. The first removal process, which defines the junction, may include ion milling, reactive ion etching (RIE), deep RIE, inductively coupled plasma RIE, or other suitable removal process as known in the art.

Figure 19C:
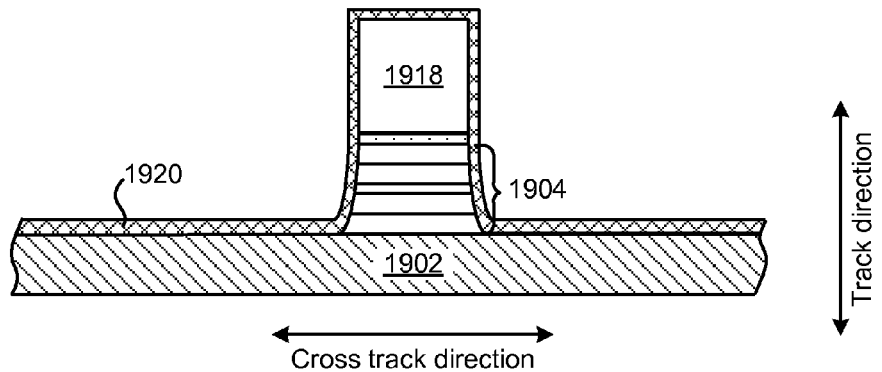

As shown in FIG. 19C, a first isolation layer 1920 may then be deposited (e.g., via atomic layer deposition, chemical vapor deposition, or other known deposition techniques) above the mask 1918 and above the floor of the structure (i.e., the regions of the lower magnetic shield 1902 left exposed after the first removal process). The first isolation layer 1920 may preferably include nonmagnetic and electrically insulating material(s) such as TaO, SiN, AlO, $Al_2O_3$, SiO, MgO, TiO, combinations thereof, etc.

Figure 19D:
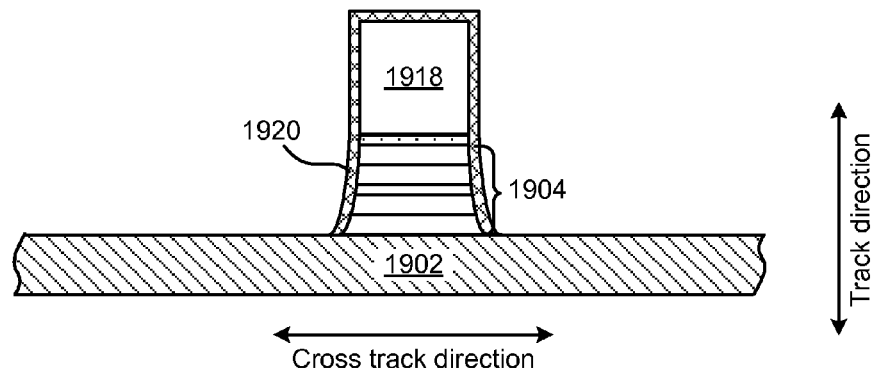

As shown in FIG. 19D, the portion(s) of the first isolation layer 1920 deposited on the floor of the structure may be removed by a second removal process. This second removal process may also include ion milling, RIE, deep RIE, inductively coupled plasma RIE, or other suitable removal process as known in the art. Removal of the portion(s) of the first isolation layer 1920 deposited on the floor of the structure is important so as to facilitate the direct exchange coupling between the lower magnetic shield 1902 and a to-be-deposited lower stabilization layer 1922, discussed in detail below. Moreover, in approaches where the magnetic bias structure (not shown in FIG. 19D) comprises soft magnetic material, the second removal process may also be implemented to ensure that the magnetic bias structure has the proper shape anisotropy (e.g., a width in the cross track direction that is preferably small relative to its length in the element height direction).

Figure 19E:
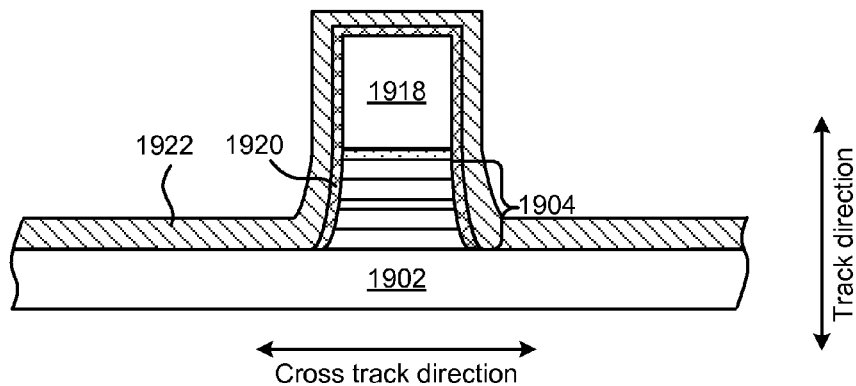

As shown in FIG. 19E, a lower stabilization layer 1922 may then be deposited on the floor of the structure and the mask 1918. In the particular embodiment shown in FIG. 19E, the lower stabilization layer 1922 comprises one or more soft magnetic materials, including, but not limited to, NiFe, CoFe, NiFeCr, CoNiFe, alloys thereof, and other such suitable soft magnetic materials having a low magnetic coercivity as known in the art. As the first isolation layer 1920 is not present on the floor of the structure, the lower stabilization layer 1922 is in direct contact, and thus "makes" a connection, with the lower magnetic shield 1902. Accordingly, the lower stabilization layer 1922 is directly exchanged coupled to the lower magnetic shield 1902. The remaining portions of the first isolation layer 1920 protect the sidewalls 1924 of the sensor stack 1904 and prevent shunting.

Figure 19F:
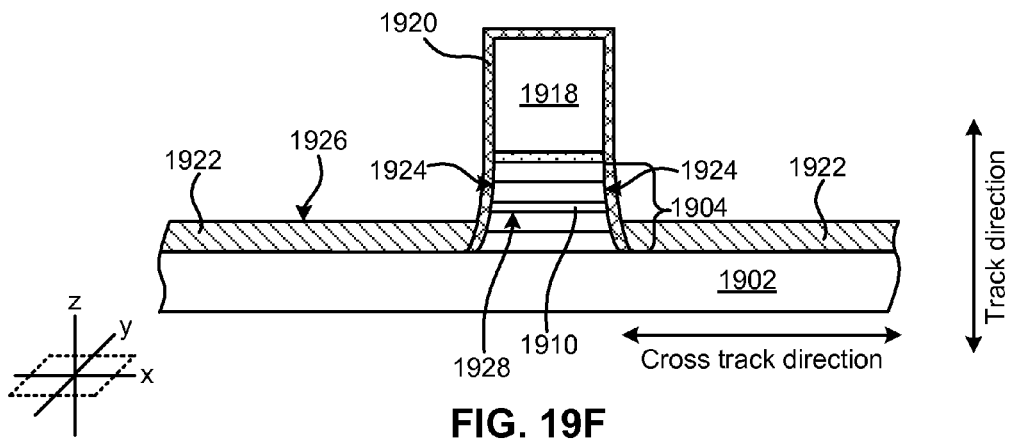

As shown in FIG. 19F, a third removal process is performed to clean the sidewalls 1924 of the sensor stack 1904, thereby removing portions of the lower stabilization layer 1922 deposited thereon. This third removal process may also include ion milling, RIE, deep RIE, inductively coupled plasma RIE, or other suitable removal process as known in the art. In preferred approaches, after the third removal process, the upper surface 1926 of the lower stabilization layer 1922 may be below the x-y plane extending along the lower surface 1928 of the separation layer 1910.

Figure 19G:
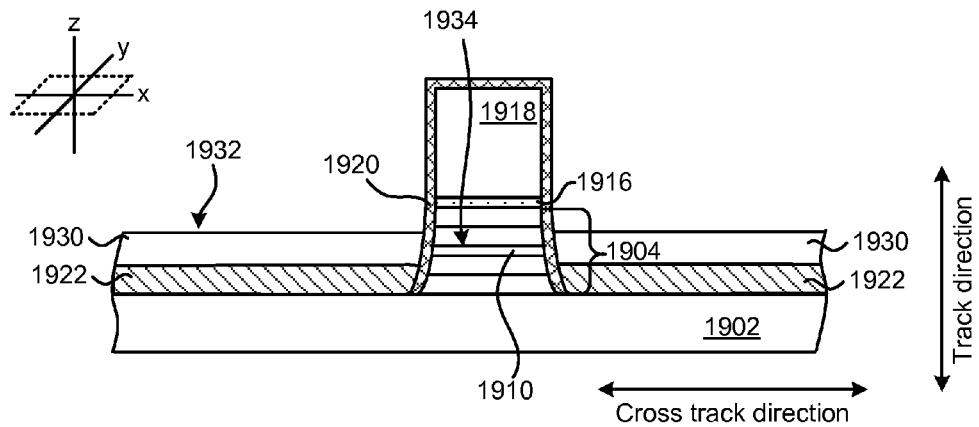

As shown in FIG. 19G, a second isolation layer 1930 is next vertically deposited above the lower stabilization layer 1922. In preferred approaches, the upper surface 1932 of the second isolation layer 1930 may be positioned above the x-y plane extending along the upper surface 1934 of the separation layer 1910. The second isolation layer 1930 may preferably be nonmagnetic and electrically insulating. Suitable materials for the second isolation layer 1930 may include TaO, SiN, AlO, $Al_2O_3$, SiO, MgO, TiO, combinations thereof, etc. In some approaches, the first and second isolation layers 1920, 1930 may comprise the same materials, or one or more different materials from one another.

Figure 19H:
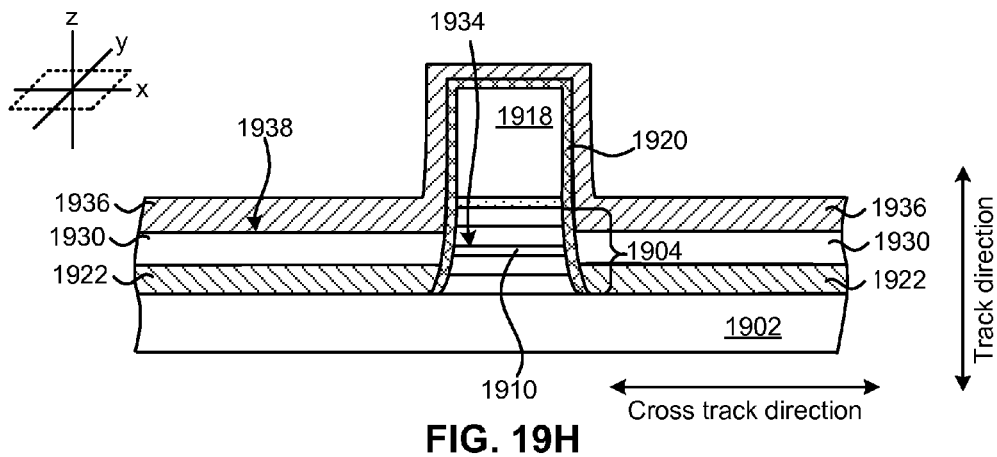

As shown in FIG. 19H, an upper stabilization layer 1936 is then deposited above the structure (e.g., above the second isolation layer 1930 and the mask 1918). In the particular embodiment shown in FIG. 19H, the upper stabilization layer 1936 comprises one or more soft magnetic materials, including, but not limited to, NiFe, CoFe, NiFeCr, CoNiFe, alloys thereof, and other such suitable soft magnetic materials having a low magnetic coercivity as known in the art. In preferred approaches, the lower surface 1938 of the upper stabilization layer 1936 may be above the x-y plane extending along the upper surface 1934 of the separation layer 1910. The presence of the second isolation layer 1930 prevents the upper stabilization layer 1936 from shunting to the lower stabilization layer 1922.

Figure 19I:
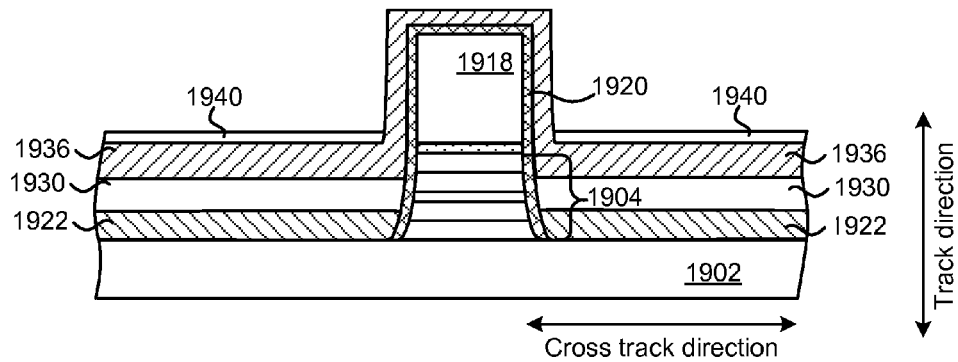

As shown in FIG. 19I, a layer of material that is resistant to chemical mechanical polishing (a CMP stop layer 1940) is vertically deposited above the upper stabilization layer 1936. In preferred approaches, the CMP stop layer 1940 may comprise diamond like carbon.

Figure 19J:
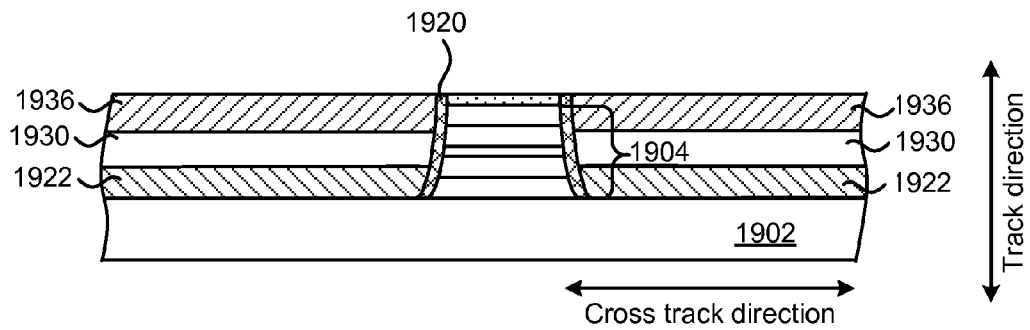

As shown in FIG. 19J, the mask 1918 is removed via a chemical liftoff process or other suitable liftoff process known in the art. The surface from which the mask 1918 is removed may be subject to a planarization process (e.g., chemical mechanical polishing) to achieve a substantially flat upper surface. A fourth removal process, such as RIE, may then be performed to remove the CMP stop layer 1940.

Figure 19K:
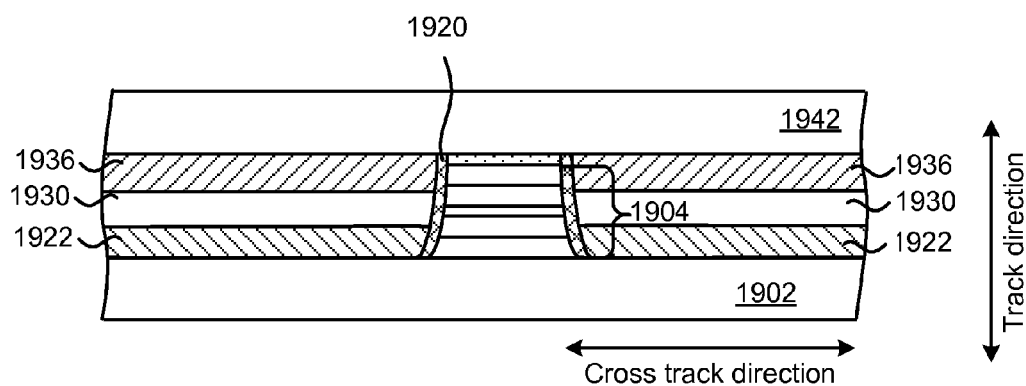

As shown in FIG. 19K, an upper magnetic shield 1942 is deposited above the upper stabilization layer 1936, the sensor stack 1904, and the magnetic bias structure (not shown). The upper magnetic shield 1942 may comprise one or more magnetic materials having a high magnetic permeability (g) to provide effective magnetic shielding. In particular approaches, the upper magnetic shield 1942 may comprise one or more layers, where each layer may independently include NiFe, and/or CoFe, and/or other suitable magnetic materials as would become apparent to one having skill in the art upon reading the present disclosure.

It should be noted that methodology presented herein for at least some of the various embodiments may be implemented, in whole or in part, in computer hardware, software, by hand, using specialty equipment, etc. and combinations thereof. Moreover, any of the structures and/or steps may be implemented using known materials and/or techniques, as would become apparent to one skilled in the art upon reading the present specification.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A magnetic sensor, comprising:
   a lower scissor free layer;
   an upper scissor free layer above the lower scissor free layer;
   a separation layer between the upper and lower scissor free layers; and
   upper stabilization layers on opposite sides of the upper scissor free layer in a cross-track direction, wherein lower surfaces of the upper stabilization layers are above a plane extending along a top surface of the separation layer.

2. The magnetic sensor as recited in claim 1, wherein the upper stabilization layers include hard magnetic material.

3. The magnetic sensor as recited in claim 2, further comprising: an upper shield above the upper scissor free layer; and a decoupling layer between the upper stabilization layers and the upper shield.

4. The magnetic sensor as recited in claim 1, wherein the upper stabilization layers include soft magnetic material.

5. The magnetic sensor as recited in claim 4, further comprising an upper shield above the upper scissor free layer, wherein the upper stabilization layers are directly exchange coupled to the upper shield.

6. The magnetic sensor as recited in claim 1, further comprising lower stabilization layers on opposite sides of the lower scissor free layer in a cross-track direction, wherein upper surfaces of the lower stabilization layers are below a plane extending along a bottom surface of the separation layer.

7. The magnetic sensor as recited in claim 6, wherein the lower stabilization layers include hard magnetic material.

8. The magnetic sensor as recited in claim 7, further comprising: a lower shield below the lower scissor free layer; and a decoupling layer between the lower stabilization layers and the lower shield.

9. The magnetic sensor as recited in claim 7, wherein the upper stabilization layers include hard magnetic material, and further comprising an upper shield above the upper scissor free layer, and a decoupling layer between the upper stabilization layers and the upper shield.

10. The magnetic sensor as recited in claim 7, wherein the upper stabilization layers include soft magnetic material, and further comprising an upper shield above the upper scissor free layer, wherein the upper stabilization layers are directly exchange coupled to the upper shield.

11. The magnetic sensor as recited in claim 6, wherein the lower stabilization layers include soft magnetic material.

12. The magnetic sensor as recited in claim 11, further comprising a lower shield below the lower scissor free layer, wherein the lower stabilization layers are directly exchange coupled to the lower shield.

13. The magnetic sensor as recited in claim 11, wherein the upper stabilization layers include hard magnetic material, and further comprising an upper shield above the upper scissor free layer, and a decoupling layer between the upper stabilization layers and the upper shield.

14. The magnetic sensor as recited in claim 11, wherein the upper stabilization layers include soft magnetic material, and further comprising an upper shield above the lower scissor free layer, wherein the upper stabilization layers are directly exchange coupled to the upper shield.

15. The magnetic sensor as recited in claim 6, further comprising an isolation layer on opposite sides of the separation layer between the upper and lower stabilization layers, a deposition thickness of the isolation layer being greater than a deposition thickness of the separation layer.

16. The magnetic sensor as recited in claim 1, comprising a lower shield below the lower scissor free layer, the lower shield having a notch extending therefrom towards the lower scissor free layer.

17. The magnetic sensor as recited in claim 16, comprising a nonmagnetic decoupling layer positioned between the notch and the lower scissor free layer.

18. A magnetic data storage system, comprising:
at least one magnetic head including the magnetic sensor as recited in claim 1;
a magnetic medium;
a drive mechanism for passing the magnetic medium over the at least one magnetic head; and
a controller electrically coupled to the at least one magnetic head for controlling operation of the at least one magnetic head.

19. A magnetic sensor, comprising:
a lower scissor free layer;
an upper scissor free layer above the lower scissor free layer;
a separation layer between the upper and lower scissor free layers; and
lower stabilization layers on opposite sides of the lower scissor free layer in a cross-track direction,
wherein upper surfaces of the lower stabilization layers are below a plane extending along a bottom surface of the separation layer.

20. The magnetic sensor as recited in claim 19, wherein the lower stabilization layers comprise soft magnetic material or hard magnetic material.

21. The magnetic sensor as recited in claim 19, further comprising upper stabilization layers on opposite sides of the upper scissor free layer in a cross-track direction, wherein lower surfaces of the upper stabilization layers are above a plane extending along an upper surface of the separation layer.

22. The magnetic sensor as recited in claim 21, wherein the upper stabilization layers comprise soft magnetic material or hard magnetic material.

23. The magnetic sensor as recited in claim 19, comprising an upper shield above the upper scissor free layer, the upper shield having a notch extending away from the upper scissor free layer.

24. The magnetic sensor as recited in claim 23, comprising a nonmagnetic decoupling layer positioned between the notch and the upper scissor free layer.

25. A magnetic data storage system, comprising:
at least one magnetic head including the magnetic sensor as recited in claim 19;
a magnetic medium;
a drive mechanism for passing the magnetic medium over the at least one magnetic head; and
a controller electrically coupled to the at least one magnetic head for controlling operation of the at least one magnetic head.

* * * * *